US012653031B2

(12) United States Patent 
Yu et al.

(10) Patent No.: US 12,653,031 B2 
(45) Date of Patent: Jun. 9, 2026

(54) DUMMY DIES FOR REDUCING WARPAGE IN PACKAGES

(71) Applicant: Taiwan Semiconductor Manufacturing Co., Ltd., Hsinchu (TW)

(72) Inventors: Chen-Hua Yu, Hsinchu (TW); Tin-Hao Kuo, Hsinchu (TW); Hao-Yi Tsai, Hsinchu (TW); Chung-Shi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 757 days.

(21) Appl. No.: 17/316,207

(22) Filed: May 10, 2021

(65) Prior Publication Data

US 2021/0265284 A1 Aug. 26, 2021

Related U.S. Application Data

(62) Division of application No. 16/273,887, filed on Feb. 12, 2019, now Pat. No. 11,004,803.

(Continued)

(51) Int. Cl.
*H01L 23/64* (2006.01)
*H01L 21/48* (2006.01)
(Continued)

(52) U.S. Cl.
CPC ........ *H01L 23/562* (2013.01); *H01L 21/4857* (2013.01); *H01L 21/561* (2013.01);
(Continued)

(58) Field of Classification Search
CPC . H01L 2221/68345; H01L 2221/68359; H01L 2224/16227; H01L 2224/04105;
(Continued)

(56) References Cited

U.S. PATENT DOCUMENTS 4,095,867 A * 6/1978 Parks ................... H05K 1/0221
439/329
8,361,842 B2 1/2013 Yu et al.
(Continued)

FOREIGN PATENT DOCUMENTS

CN 106098637 A 11/2016
CN 108122861 A 6/2018
(Continued)

*Primary Examiner* — Ajay Ojha
*Assistant Examiner* — Tsz K Chiu
(74) *Attorney, Agent, or Firm* — Slater Matsil, LLP

(57) ABSTRACT

A method includes placing a plurality of functional dies over a carrier, placing a plurality of dummy dies over the carrier, encapsulating the plurality of functional dies and the plurality of dummy dies in an encapsulant, and forming redistribution lines over and interconnecting the plurality of functional dies. The redistribution lines, the plurality of functional dies, the plurality of dummy dies, and the encapsulant in combination form a reconstructed wafer. The plurality of functional dies are in a center region of the reconstructed wafer, and the plurality of dummy dies are in a peripheral region of the reconstructed wafer, with the peripheral region encircling the center region. The reconstructed wafer is de-bonded from the carrier. The reconstructed wafer is bonded to a package component selected from the group consisting essentially of an interposer, a package substrate, a printed circuit board, a thermal module, and combinations thereof.

20 Claims, 19 Drawing Sheets

Related U.S. Application Data

(60) Provisional application No. 62/693,185, filed on Jul. 2, 2018.

(51) Int. Cl.

| | |
|---|---|
| *H01L 21/56* | (2006.01) |
| *H01L 21/683* | (2006.01) |
| *H01L 23/00* | (2006.01) |
| *H01L 23/40* | (2006.01) |
| *H01L 23/538* | (2006.01) |

(52) U.S. Cl.
CPC ........ *H01L 21/568* (2013.01); *H01L 23/4006* (2013.01); *H01L 24/94* (2013.01)

(58) Field of Classification Search
CPC . H01L 2224/12105; H01L 2224/24137; H01L 2224/24195; H01L 2224/32225; H01L 2224/73267; H01L 2225/1058; H01L 2225/1094; H01L 2924/15311; H01L 2924/19105; H01L 2224/02331; H01L 2224/02373; H01L 2224/02381; H01L 24/94; H01L 24/19; H01L 24/02; H01L 24/97; H01L 25/0655; H01L 25/50; H01L 25/18; H01L 25/0652; H01L 23/562; H01L 23/4006; H01L 23/49816; H01L 23/5389; H01L 23/49811; H01L 23/5384; H01L 23/31; H01L 23/525; H01L 21/6835; H01L 23/3128; H01L 21/568; H01L 25/105; H01L 2225/1035; H01L 2224/92244; H01L 23/5383; H01L 2224/97; H01L 21/561; H01L 2224/73204; H01L 24/20; H01L 25/0657; H01L 21/4857; H01L 2224/32145; H01L 24/73; H01L 2224/73265; H01L 24/32; H01L 2221/68372; H01L 2224/48227; H01L 2225/1041; H01L 21/486; H01L 2924/18162; H01L 24/16; H01L 2224/0401; H01L 2224/214; H01L 2225/0651; H01L 21/56; H01L 2224/48091; H01L 2224/92125; H01L 23/5386; H01L 2225/06568; H01L 25/16; H01L 21/4853; H01L 21/565; H01L 23/5385; H01L 2224/81005; H01L 24/48; H01L 24/92; H01L 23/481; H01L 2924/19041; H01L 2224/16145; H01L 2924/181; H01L 2221/68381; H01L 23/49827; H01L 2221/68327; H01L 2924/3511; H01L 2224/18; H01L 2924/19042; H01L 23/3121; H01L 2924/19043; H01L 2224/94; H01L 23/49822; H01L 2224/83005; H01L 23/49838; H01L 2225/06541; H01L 2924/18161; H01L 21/78; H01L 23/3135; H01L 2225/06548; H01L 2224/73259; H01L 24/08; H01L 24/13; H01L 24/83; H01L 2924/15192; H01L 25/03; H01L 2224/2919; H01L 24/24; H01L 2224/06181; H01L 21/563; H01L 2224/131; H01L 24/17; H01L 2224/02379; H01L 2225/06517; H01L 2924/19011; H01L 2224/08145; H01L 23/3114; H01L 2224/0231; H01L 23/50; H01L 24/81; H01L 24/96; H01L 2224/13147; H01L 2224/73253; H01L 24/80; H01L 2224/96; H01L 2224/9222; H01L 24/05; H01L 21/6836; H01L 2224/32245; H01L 2224/2518; H01L 23/3107; H01L 24/11; H01L 2225/06513; H01L 2924/1434; H01L 23/5226; H01L 23/367; H01L 23/49833; H01L 23/528; H01L 24/29; H01L 2224/16265; H01L 24/03; H01L 2924/19104; H01L 2224/81815; H01L 24/09; H01L 2924/1431; H01L 2224/13082; H01L 2224/73251; H01L 2224/80895; H01L 2221/68331; H01L 2221/68354; H01L 2224/80896; H01L 21/76898; H01L 2224/13144; H01L 2224/83192; H01L 2225/06524; H01L 2225/1023; H01L 23/485; H01L 2224/11462; H01L 2224/73209; H01L 2224/92224; H01L 2924/00014; H01L 2224/11334; H01L 2224/11849; H01L 2224/16225; H01L 2224/24147; H01L 2224/48145; H01L 2924/3025; H01L 2224/215; H01L 2224/26175; H01L 2224/33181; H01L 2224/73217; H01L 2224/73227; H01L 2225/06506; H01L 2225/0652; H01L 23/24; H01L 23/3185; H01L 24/33; H01L 25/165; H01L 2924/15331; H01L 2924/186; H01L 2023/4068; H01L 2023/4075; H01L 21/306; H01L 21/76837; H01L 22/32; H01L 2224/04026; H01L 2224/05166; H01L 2224/05666; H01L 2224/05684; H01L 2224/1132; H01L 2224/13124; H01L 2224/2101; H01L 2224/221; H01L 2224/24153; H01L 2224/24221; H01L 2224/32501; H01L 2224/73201; H01L 2224/80805; H01L 2224/81191; H01L 2224/82345; H01L 2224/82365; H01L 2224/82385; H01L 2224/8301; H01L 2224/83385; H01L 23/28; H01L 23/3157; H01L 23/49575; H01L 23/5227; H01L 23/53238; H01L 23/647; H01L 24/25; H01L 24/85; H01L 24/95; H01L 25/0756; H01L 25/117; H01L 2924/0665; H01L 2924/10253; H01L 2924/13091; H01L 2924/35121; H01L 2224/023; H01L 2224/02375; H01L 2224/05008; H01L 2224/05181; H01L 2224/05186; H01L 2224/11424; H01L 2224/1144; H01L 2224/11452; H01L 2224/11464; H01L 2224/13022; H01L 2224/17051; H01L 2224/24146; H01L 2224/26145; H01L 2224/291; H01L 2224/73104; H01L 2224/80379; H01L 2224/80948; H01L 2224/81024; H01L 2224/82005; H01L 2224/83851; H01L 2224/92; H01L 2224/9202; H01L 2224/92247; H01L 2225/06537; H01L 2225/06555; H01L 2225/06596; H01L 2225/1064; H01L 23/49503; H01L 2924/00012; H01L 2924/15156; H01L 2924/15172; H01L 2924/15182; H01L 2924/1816; H01L 21/31058; H01L 21/4846; H01L 2223/6672; H01L 2224/02205; H01L 2224/02215; H01L 2224/0345; H01L 2224/05611; H01L 2224/05655; H01L 2224/10122; H01L 2224/1133; H01L 2224/11831; H01L 2224/20; H01L 2224/27436; H01L 2224/29099; H01L
2224/2929; H01L 2224/2939; H01L
2224/45099; H01L 2224/45147; H01L
2224/80013; H01L 2224/8081; H01L
2224/80906; H01L 2224/81801; H01L
2224/82106; H01L 2224/83; H01L
2224/85; H01L 2224/85399; H01L
2224/92164; H01L 2224/92225; H01L
2225/06565; H01L 23/29; H01L 23/495;
H01L 23/49805; H01L 23/49866; H01L
23/532; H01L 23/53228; H01L 23/544;
H01L 25/071; H01L 2924/01029; H01L
2924/0105; H01L 2924/05442; H01L
2924/10156; H01L 2924/1203; H01L
2924/1304; H01L 21/3043; H01L
21/76835; H01L 22/12; H01L
2224/02333; H01L 2224/02371; H01L
2224/03462; H01L 2224/05025; H01L
2224/05157; H01L 2224/05567; H01L
2224/08265; H01L 2224/09181; H01L
2224/09517; H01L 2224/1184; H01L
2224/13023; H01L 2224/1319; H01L
2224/1411; H01L 2224/2512; H01L
2224/29139; H01L 2224/73215; H01L
2224/80001; H01L 2224/80905; H01L
2224/81; H01L 2224/81203; H01L
2224/83801; H01L 2224/8384; H01L
2224/83862; H01L 2224/83865; H01L
2224/83874; H01L 2224/83895; H01L
2224/83931; H01L 2224/92144; H01L
2224/92242; H01L 23/10; H01L 23/3735;
H01L 23/5221; H01L 23/5222; H01L
23/60; H01L 23/64; H01L 2924/10157;
H01L 2924/10158; H01L 2924/1205;
H01L 2924/1427; H01L 2924/1437;
H01L 2924/1461; H01L 2924/15313;
H01L 2924/20; H01L 2924/30105; H01L
2023/4087; H01L 21/02118; H01L
21/02282; H01L 21/311; H01L 21/32051;
H01L 21/4871; H01L 21/4882; H01L
21/52; H01L 2223/54406; H01L
2223/54426; H01L 2223/54433; H01L
2223/5448; H01L 2224/02145; H01L
2224/02166; H01L 2224/03002; H01L
2224/0346; H01L 2224/0362; H01L
2224/03622; H01L 2224/03845; H01L
2224/04; H01L 2224/05558; H01L
2224/05638; H01L 2224/05639; H01L
2224/05644; H01L 2224/05686; H01L
2224/08123; H01L 2224/09103; H01L
2224/13008; H01L 2224/13009; H01L
2224/13199; H01L 2224/133; H01L
2224/13644; H01L 2224/13655; H01L
2224/13664; H01L 2224/16503; H01L
2224/24227; H01L 2224/25171; H01L
2224/32013; H01L 2224/32265; H01L
2224/48225; H01L 2224/48228; H01L
2224/48235; H01L 2224/49052; H01L
2224/73205; H01L 2224/8009; H01L
2224/80099; H01L 2224/80203; H01L
2224/81192; H01L 2224/81193; H01L
2224/8123; H01L 2224/814; H01L
2224/8181; H01L 2224/81895; H01L
2224/8349; H01L 2224/92222; H01L
2225/1011; H01L 2225/1052; H01L 2225/107; H01L 2225/1082; H01L 23/12;
H01L 23/3192; H01L 23/373; H01L
23/4012; H01L 23/46; H01L 24/00; H01L
24/26; H01L 25/00; H01L 25/04; H01L
25/162; H01L 2924/12042; H01L
2924/1306; H01L 2924/1421; H01L
2924/1903; H01L 2023/4081; H01L
21/02; H01L 21/0337; H01L 21/288;
H01L 21/31138; H01L 21/3212; H01L
21/4821; H01L 21/7684; H01L 21/76885;
H01L 22/14; H01L 22/20; H01L 22/22;
H01L 2221/68386; H01L 2223/5442;
H01L 2223/54453; H01L 2224/0233;
H01L 2224/03452; H01L 2224/03464;
H01L 2224/0347; H01L 2224/03612;
H01L 2224/03614; H01L 2224/03826;
H01L 2224/05022; H01L 2224/05139;
H01L 2224/05144; H01L 2224/05155;
H01L 2224/05164; H01L 2224/05569;
H01L 2224/05573; H01L 2224/056;
H01L 2224/08135; H01L 2224/08151;
H01L 2224/091; H01L 2224/11; H01L
2224/1146; H01L 2224/1147; H01L
2224/1148; H01L 2224/13016; H01L
2224/1302; H01L 2224/13084; H01L
2224/13109; H01L 2224/1403; H01L
2224/14051; H01L 2224/14517; H01L
2224/17136; H01L 2224/2105; H01L
2224/24011; H01L 2224/24135; H01L
2224/25174; H01L 2224/25177; H01L
2224/26; H01L 2224/29006; H01L
2224/32135; H01L 2224/32227; H01L
2224/40135; H01L 2224/48108; H01L
2224/48135; H01L 2224/48137; H01L
2224/48157; H01L 2224/48465; H01L
2224/49173; H01L 2224/80009; H01L
2224/80011; H01L 2224/80048; H01L
2224/80801; H01L 2224/80815; H01L
2224/811; H01L 2224/8113; H01L
2224/81132; H01L 2224/81862; H01L
2224/81904; H01L 2224/82; H01L
2224/82951; H01L 2224/85444; H01L
2224/85455; H01L 2225/06531; H01L
2225/06558; H01L 23/04; H01L 23/14;
H01L 23/15; H01L 23/473; H01L
23/49534; H01L 23/49568; H01L 23/52;
H01L 23/53209; H01L 23/564; H01L
24/10; H01L 24/28; H01L 24/30; H01L
24/31; H01L 24/89; H01L 25/073; H01L
25/074; H01L 2924/01322; H01L
2924/141; H01L 2924/142; H01L
2924/1443; H01L 2924/14511; H01L
2924/15174; H01L 2924/15321; H01L
2924/15322; H01L 2924/30107

See application file for complete search history.

(56) References Cited

U.S. PATENT DOCUMENTS

| | | | |
|---|---|---|---|
| 8,680,647 | B2 | 3/2014 | Yu et al. |
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |

(56)                    References Cited

U.S. PATENT DOCUMENTS

| | | | |
|---|---|---|---|
| 8,829,676 | B2 | 9/2014 | Yu et al. |
| 8,877,554 | B2 | 11/2014 | Tsai et al. |
| 9,093,337 | B2 | 7/2015 | Hwang et al. |
| 9,425,126 | B2 * | 8/2016 | Kuo ........................ H01L 23/528 |
| 9,613,931 | B2 | 4/2017 | Lin et al. |
| 9,685,350 | B2 | 6/2017 | Lin et al. |
| 9,865,567 | B1 * | 1/2018 | Chaware ................. H01L 25/50 |
| 9,984,998 | B2 * | 5/2018 | Yu ........................... H01L 21/56 |
| 10,290,571 | B2 * | 5/2019 | Yu ........................... H01L 24/32 |
| 10,431,517 | B2 * | 10/2019 | Wuu ..................... H01L 23/367 |
| 10,510,674 | B2 | 12/2019 | Lin et al. |
| 10,510,712 | B2 | 12/2019 | Hwang et al. |
| 11,183,487 | B2 * | 11/2021 | Lai ........................... H01L 21/78 |
| 11,817,443 | B2 * | 11/2023 | Kim ................... H01L 23/5384 |
| 2011/0215470 | A1 * | 9/2011 | Chen ...................... H01L 23/52 |
| | | | 257/773 |
| 2011/0291288 | A1 | 12/2011 | Wu et al. |
| 2012/0061856 | A1 | 3/2012 | Vora |
| 2013/0009301 | A1 | 1/2013 | Iwayama et al. |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0119552 | A1 | 5/2013 | Lin et al. |
| 2013/0168848 | A1 | 7/2013 | Lin et al. |
| 2013/0217184 | A1 | 8/2013 | Ishizuki et al. |
| 2013/0307140 | A1 | 11/2013 | Huang et al. |
| 2014/0008811 | A1 | 1/2014 | Yap et al. |
| 2014/0203429 | A1 | 7/2014 | Yu et al. |
| 2014/0225222 | A1 | 8/2014 | Yu et al. |
| 2014/0252646 | A1 | 9/2014 | Hung et al. |
| 2014/0264930 | A1 | 9/2014 | Yu et al. |
| 2014/0287553 | A1 * | 9/2014 | Lin ........................ H01L 21/568 |
| | | | 438/107 |
| 2015/0061162 | A1 * | 3/2015 | Yu ........................... H01L 24/97 |
| | | | 438/107 |
| 2015/0093858 | A1 | 4/2015 | Hwang et al. |
| 2015/0311182 | A1 | 10/2015 | Lee et al. |
| 2016/0118333 | A1 * | 4/2016 | Lin ..................... H01L 21/6836 |
| | | | 257/773 |
| 2016/0322330 | A1 * | 11/2016 | Lin ..................... H01L 25/0652 |
| 2016/0358865 | A1 * | 12/2016 | Shih .................... H01L 21/6835 |
| 2017/0196075 | A1 * | 7/2017 | Barron .................... H01L 23/40 |
| 2018/0082987 | A1 | 3/2018 | Chen et al. |
| 2018/0350755 | A1 | 12/2018 | Huang et al. |
| 2019/0115272 | A1 * | 4/2019 | Yu ........................... H01L 25/03 |
| 2019/0237412 | A1 * | 8/2019 | Lee ..................... H01L 25/0655 |
| 2019/0237454 | A1 * | 8/2019 | Hou .................... H01L 23/5384 |
| 2020/0020647 | A1 * | 1/2020 | Jee ........................ H01L 25/105 |
| 2020/0211922 | A1 * | 7/2020 | Chun ...................... H01L 25/16 |
| 2020/0395257 | A1 * | 12/2020 | Chun ................. H01L 23/5386 |
| 2021/0090983 | A1 * | 3/2021 | Lin ................... H01L 23/49866 |

FOREIGN PATENT DOCUMENTS

| | | | |
|---|---|---|---|
| CN | 108389822 | A | 8/2018 |
| DE | 102019205860 | A1 * | 10/2019 ........ H01L 21/4857 |
| TW | I597786 | B | 9/2017 |
| TW | 201807762 | A | 3/2018 |

* cited by examiner

DUMMY DIES FOR REDUCING WARPAGE IN PACKAGES

PRIORITY CLAIM AND CROSS-REFERENCE

This application is a divisional of U.S. patent application Ser. No. 16/273,887, entitled "Dummy Dies for Reducing Warpage in Packages," filed Feb. 12, 2019, which claims the benefit of the U.S. Provisional Application No. 62/693,185, filed Jul. 2, 2018, and entitled "Dummy Dies for Reducing Warpage of Packages," which applications are hereby incorporated herein by reference.

BACKGROUND

In the formation of three-dimensional integrated circuits, dies are often bonded on semiconductor wafers. The bonding process typically include selecting known-good-dies (top dies), and bonding the top dies to the bottom chips in a bottom wafer using flip chip bonding. Each of the bottom chips may be bonded to one or more top die. After the bonding, underfill is dispensed into the space between the top dies and the bottom chips, and a molding compound is molded onto the top dies and the bottom wafer. After the molding of the molding compound, the package may have a warpage due to the contraction of the molding compound. Accordingly, stresses may be generated and applied to the bottom wafer and the overlying top dies.

The situation is further worsened when the packages become increasingly larger. With the increase in the sizes of the packages, the distance from one point to another point of the package is increased, which results in the increase in the distance in which the stress can accumulate, resulting in increased stress and hence increased warpage.

In the formation of conventional packages, dummy dies are used to reduce the warpage, and dummy dies and functional dies are molded together. After the formation of RDLs connecting to the functional dies, the reconstructed wafer is sawed into a plurality of packages. The dummy dies close to the edge of the reconstructed wafer are removed. The resulting packages may or may not include dummy dies. The dummy die(s), if any, in the resulting package, are placed side-by-side with functional dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
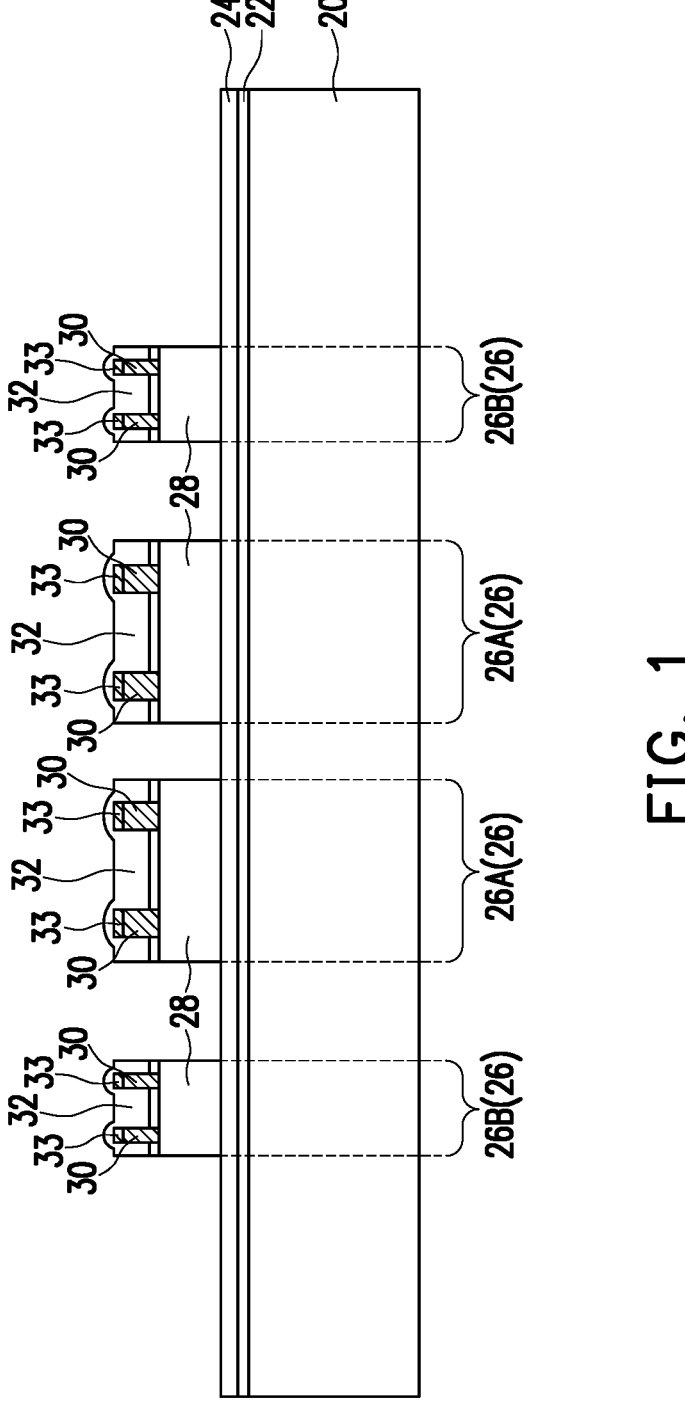
FIGS. 1 through 9 illustrate the cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower." "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with some embodiments. The intermediate stages of forming the package are illustrated in accordance with some embodiments. Some variations of some embodiments are discussed. Throughout the various views and illustrative embodiments, like reference numbers are used to designate like elements. In accordance with some embodiments of the present disclosure, dummy dies are placed in peripheral regions of reconstructed wafers, and the dummy dies may surround functional dies.

Figure 24:
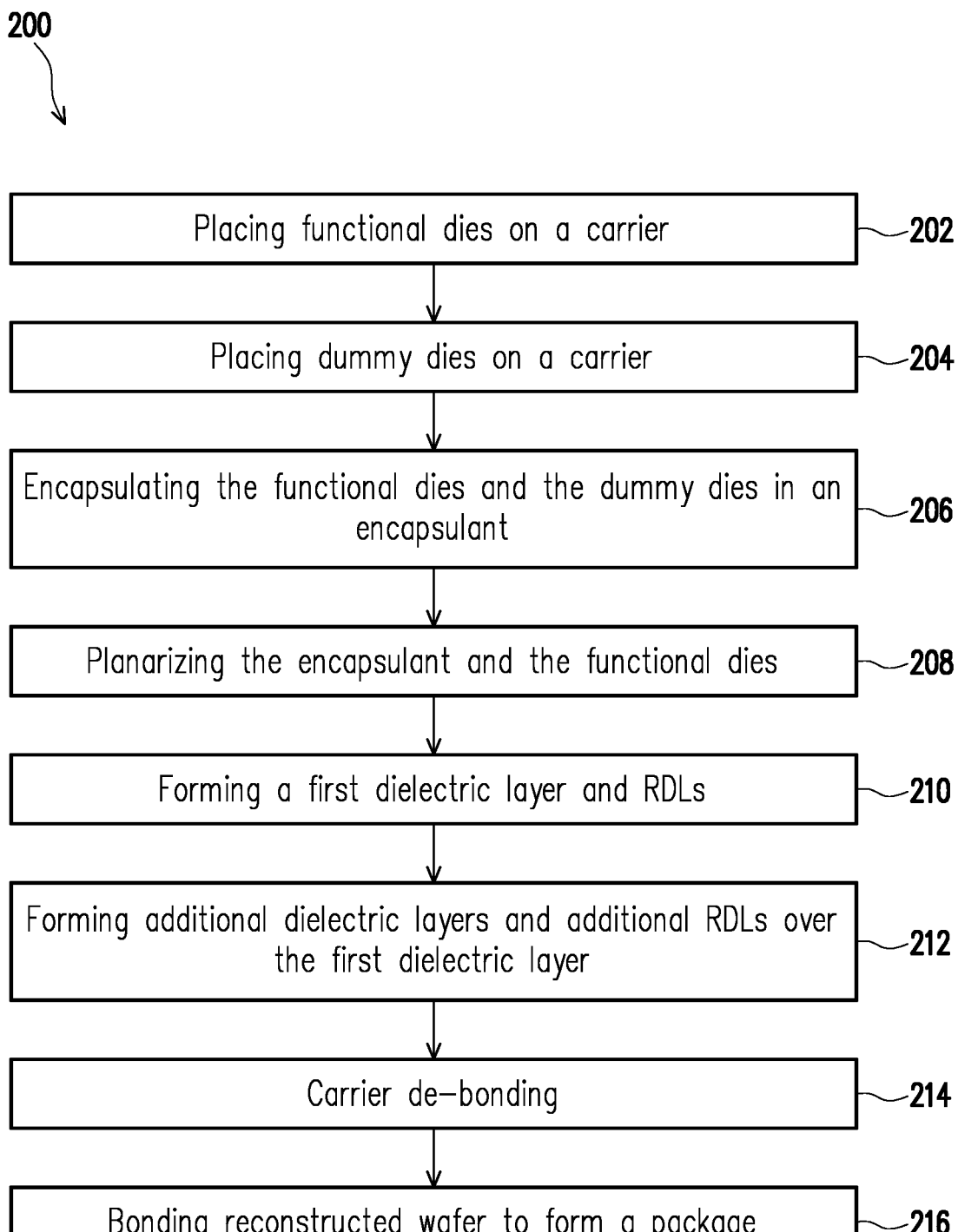
FIG. 24 illustrates a process flow for forming a package in accordance with some embodiments.

FIGS. 1 through 9 illustrate the cross-sectional views of intermediate stages in the formation of a package in accordance with some embodiments of the present disclosure. The processes shown in FIGS. 1 through 9 are also reflected schematically in the process flow 200 as shown in FIG. 24.

FIG. 1 illustrates carrier 20 and release film 22 formed over carrier 20. Carrier 20 may be a glass carrier, a ceramic carrier, or the like. Carrier 20 may have a round top-view shape, and may have a size of a typical silicon wafer. For example, carrier 20 may have an 8-inch diameter, a 12-inch diameter, or the like. Release film 22 may be formed of a polymer-based material (such as a Light-To-Heat-Conversion (LTHC) material), which may be removed along with carrier 20 from the overlying structures that will be formed in subsequent processes. In accordance with some embodiments of the present disclosure, release film 22 is formed of an epoxy-based thermal-release material. Die-Attach Film (DAF) 24 is formed over release film 22. DAF 24 is an adhesive film, and may be coated or laminated.

FIG. 1 further illustrates the placement of package components 26 (including 26A and 26B) over carrier 20. The respective process is illustrated as process 202 in the process flow shown in FIG. 24. In accordance with some embodiments of the present disclosure, package components 26 include logic dies (such as computing dies), memory dies (such as Dynamic Random Access Memory (DRAM) dies or Static Random Access Memory (SRAM) dies), photonic dies, packages (including device dies that have already been packaged), Input-output (IO) dies, digital dies, analog dies, surface-mount passive devices, die stacks such as High-Bandwidth Memory (HBM) blocks, or the like. In accordance with some embodiments, package components 26A are logic dies, while package components 26B are memory dies, IO dies, Integrated Passive Devices (IPDs) such as capacitors (multilayer ceramic capacitors (MLCCs), for example), resistors, inductors, or the like. Throughout the description, package components 26 are referred to as functional dies 26 since they have electrical functions. Functional dies 26 may have areas in the range between about 20 $mm^2$ and about 900 $mm^2$. Some examples of the areas are 100 $mm^2$ and about 400 $mm^2$.

In accordance with some embodiments of the present disclosure, functional dies 26 include semiconductor substrates 28, which may be silicon substrates, germanium substrates, or III-V compound semiconductor substrates formed of, for example, GaAs, InP, GaN, InGaAs, InAlAs, etc., Integrated circuit devices (not shown) such as transistors, diodes, resistors, capacitors, inductors, or the like, may be formed at the surfaces or over substrates 28. Interconnect structures such as metal lines and vias, which are formed in dielectric layers, are formed over and electrically coupling to the integrated circuit devices. Conductive pillars 30 are formed at the surfaces of the corresponding functional dies 26, and are electrically coupling to the integrated circuit devices in functional dies 26 through the interconnect structures. In accordance with some embodiments of the present disclosure, a relatively soft conductive material such as solder, aluminum, or the like, is used to form conductive layers 33 over conductive pillars 30. Conductive layers 33 are used for probing functional dies 26 to ensure that functional dies 26 are not defective. The probing may be performed before functional dies 26 are singulated from the respective wafer. With conductive layers 33 being softer than the underlying metal pillars 30, the probing is easier due to the improved contact between the probing card of the probing device and conductive layers 33. Dielectric layers 32 are formed to cover conductive layers 33 and metal pillars 30. Dielectric layers 32 may be formed of a polymer such as polyimide, polybenzoxazole (PBO), or the like. The arrangement of functional dies 26 are discussed in detail referring to FIGS. 11A, 11B, 12A, 12B, and 13 through 23.

Figure 2:
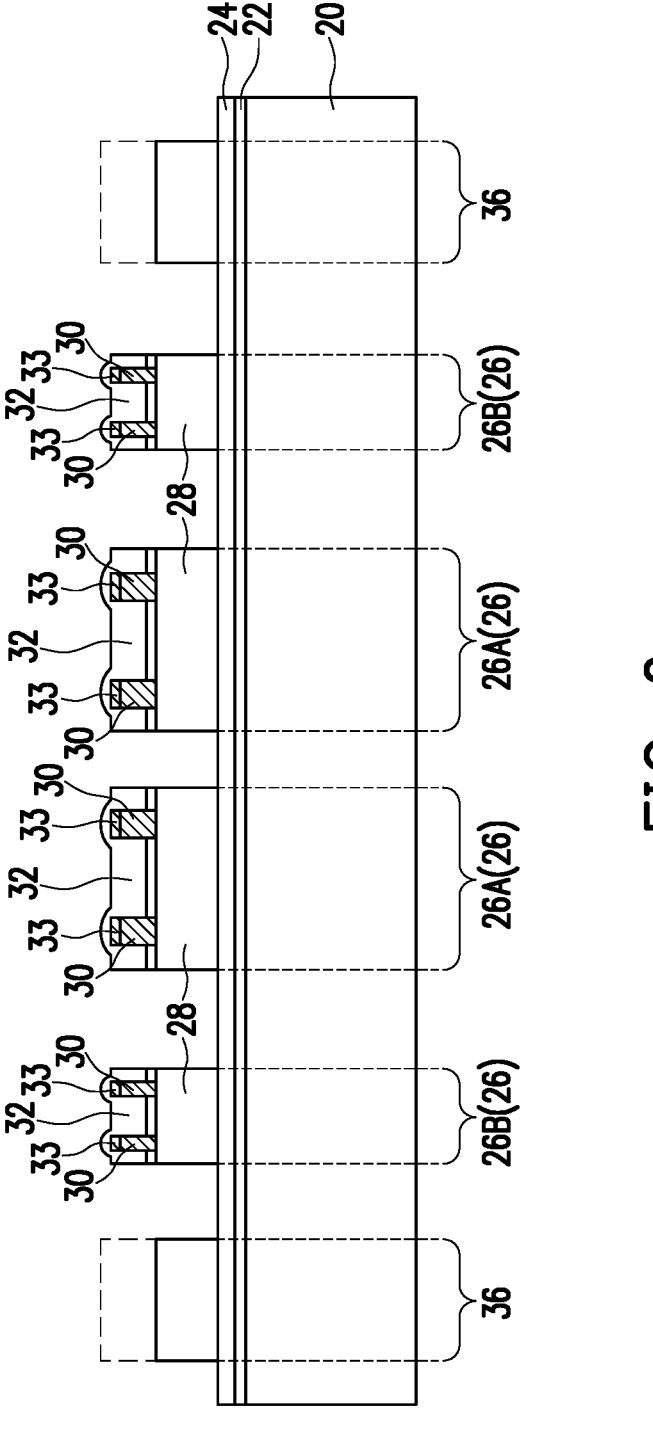
Figure 3:
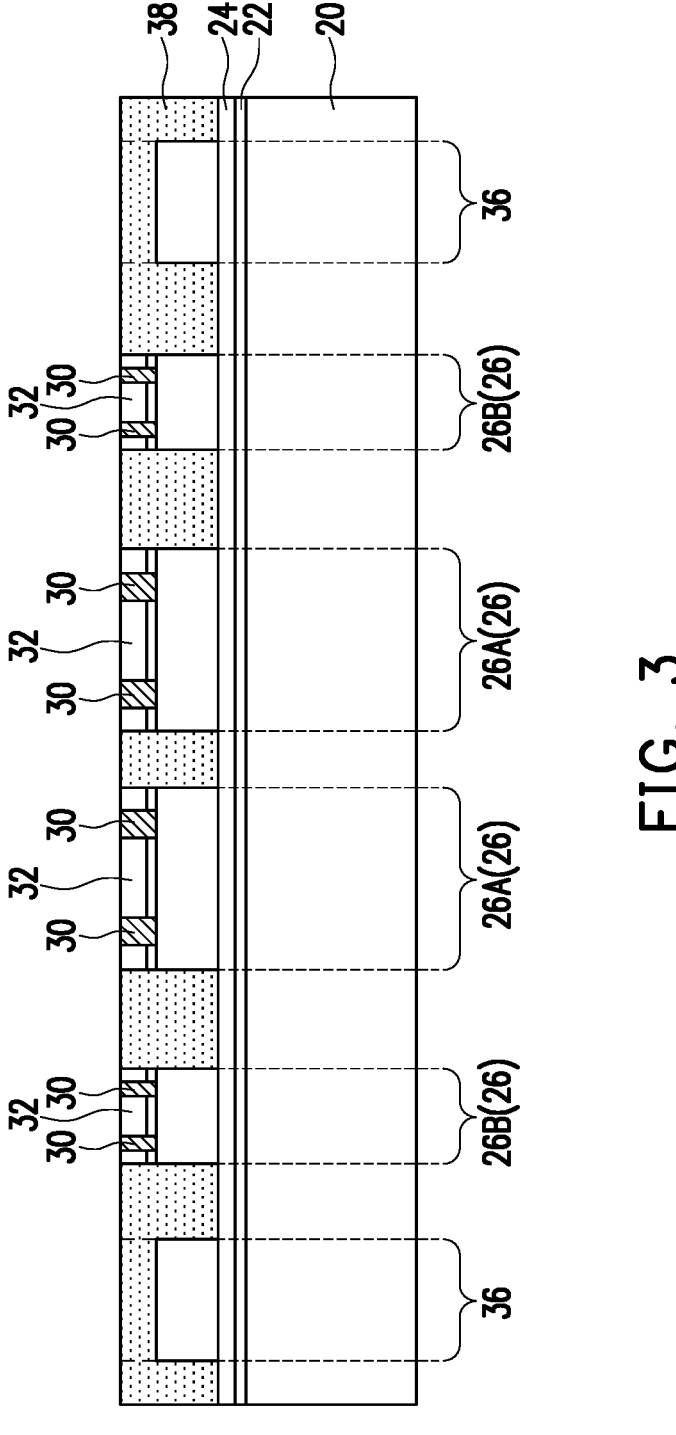

FIG. 2 illustrates the placement of dummy dies 36 on DAF 24. The respective process is illustrated as process 204 in the process flow shown in FIG. 24. Dummy dies 36 do not have electrical functions, and are not electrically connected to functional dies 26. Dummy dies 36 may be formed of conductive materials such as metals or metal alloys, semiconductor materials, dielectric materials, or the like. The material of dummy dies 36 may have coefficients of Thermal Expansion (CTEs) smaller than the CTE of the subsequently dispensed encapsulant 38 (FIG. 3). For example, dummy dies 36 may be formed of silicon, glass, quartz, copper, SiC, or the like. In accordance with some embodiments of the present disclosure, an entirety of one or more of dummy dies 36 is formed of a homogenous material, which may be selected from the aforementioned materials. In accordance with some embodiments of the present disclosure, the heights of dummy dies 36 are smaller than that of functional dies 26. In accordance with alternative embodiments of the present disclosure, the heights of dummy dies 36 are close to or greater than the heights of functional dies 26. For example, the dashed lines represent the portions of dummy dies 36 that may or may not exist. The arrangement of dummy dies 36 is discussed in detail referring to FIGS. 11A, 11B, 12A, 12B, and 13 through 23. Dummy dies 36 may have areas in the range between about 1 $mm^2$ and about 400 $mm^2$. Some examples of the areas are about 9 $mm^2$ and about 100 $mm^2$. The spacing between functional dies 26, the spacing between dummy dies 36, and the spacing between functional dies 26 and neighboring dummy dies 36 may be in the range between about 20 μm and about 15 mm. Some examples of the spacings are about 50 μm or about 1 mm.

Next, referring to FIG. 3, encapsulant 38 is encapsulated (sometimes referred to as molded) on functional dies 26 and dummy dies 36. The respective process is illustrated as process 206 in the process flow shown in FIG. 24. Encapsulant 38 fills the gaps between neighboring functional dies 26 and dummy dies 36, and may further cover components functional dies 26 and dummy dies 36. Encapsulant 38 may include a molding compound, a molding underfill, or the like. Encapsulant 38 may include a base material, which may be a polymer, an epoxy, and/or a resin, and filler particles mixed in the base material. The filler particles may be formed of silica, aluminum oxide, or the like, and may have spherical shapes.

In a subsequent step, as also shown in FIG. 3, a planarization process such as a Chemical Mechanical Polish (CMP) process or a mechanical grinding process is performed. The respective process is illustrated as process 208 in the process flow shown in FIG. 24. The top surface of encapsulant 38 is lowered by the planarization process, until metal pillars 30 are exposed. Due to the planarization, the top surfaces of metal pillars 30 are substantially coplanar with the top surface of encapsulant 38. In accordance with some embodiments of the present disclosure, the top surface of dummy dies 36 are lower than the top surface of encapsulant 38, and hence some portions of encapsulant 38 cover dummy dies 36 after the planarization process. Conductive layers 33 (FIG. 2) may be removed in the planarization process, or some bottom portions of conductive layers 33 may be left covering metal pillars 30. In accordance with alternative embodiments of the present disclosure, the top portions of dummy dies 36 are also polished, and the top surfaces of dummy dies 36 are coplanar with the top surface of encapsulant 38 after the planarization process. In accordance with yet alternative embodiments, some of dummy dies 36 have surfaces coplanar with the top surface of encapsulant 38, and some other dummy dies 36 have top surfaces lower than the top surface of encapsulant 38.

Figure 4:
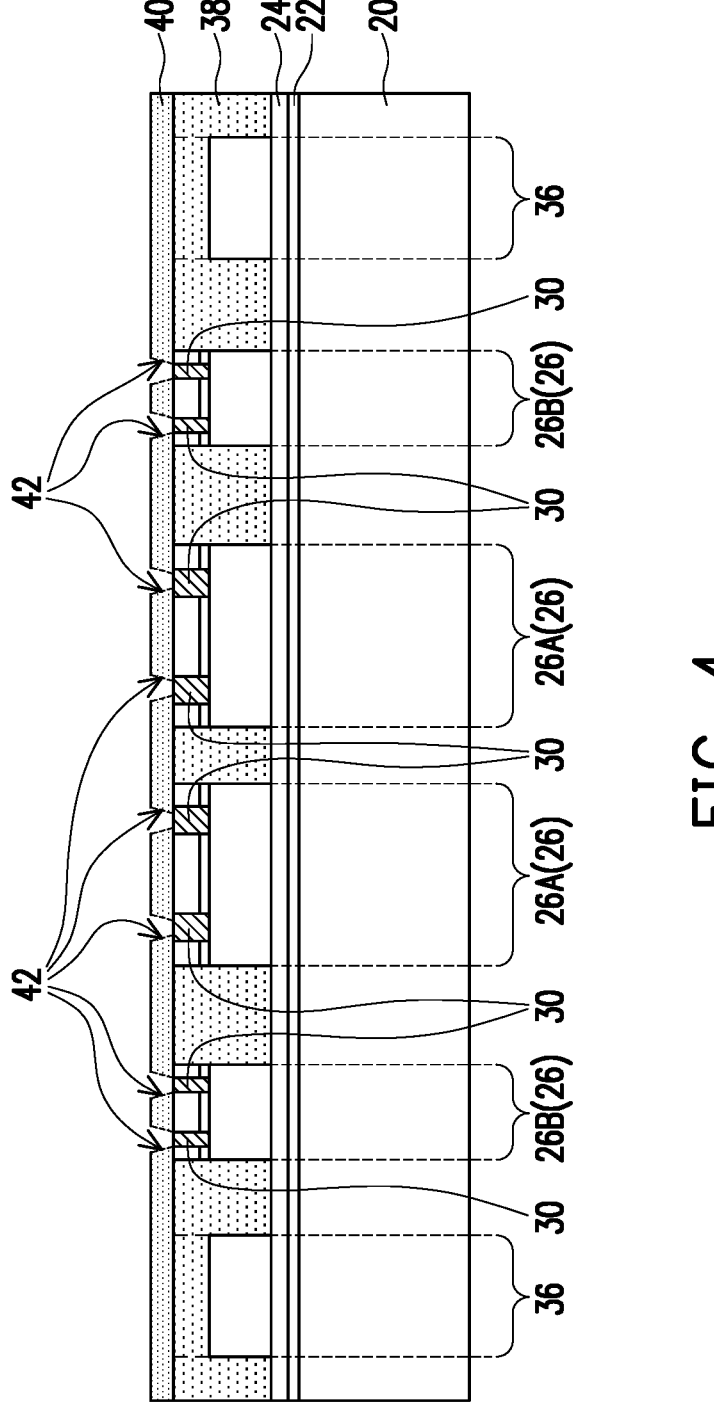

FIGS. 4 through 7 illustrate the formation of front-side Redistribution Lines (RDLs) and the respective dielectric layers. Referring to FIG. 4, dielectric layer 40 is formed. The respective process is illustrated as process 210 in the process flow shown in FIG. 24. In accordance with some embodiments of the present disclosure, dielectric layer 40 is formed of a light-sensitive polymer such as PBO, polyimide, or the like. In accordance with alternative embodiments of the present disclosure, dielectric layer 40 is formed of an inorganic material such as silicon nitride, silicon oxide, or the like. Dielectric layer 40 is patterned, for example, using a photo lithography process, so that openings 42 are formed. Metal pillars 30 of functional dies 26 are revealed through openings 42.

Figure 5:
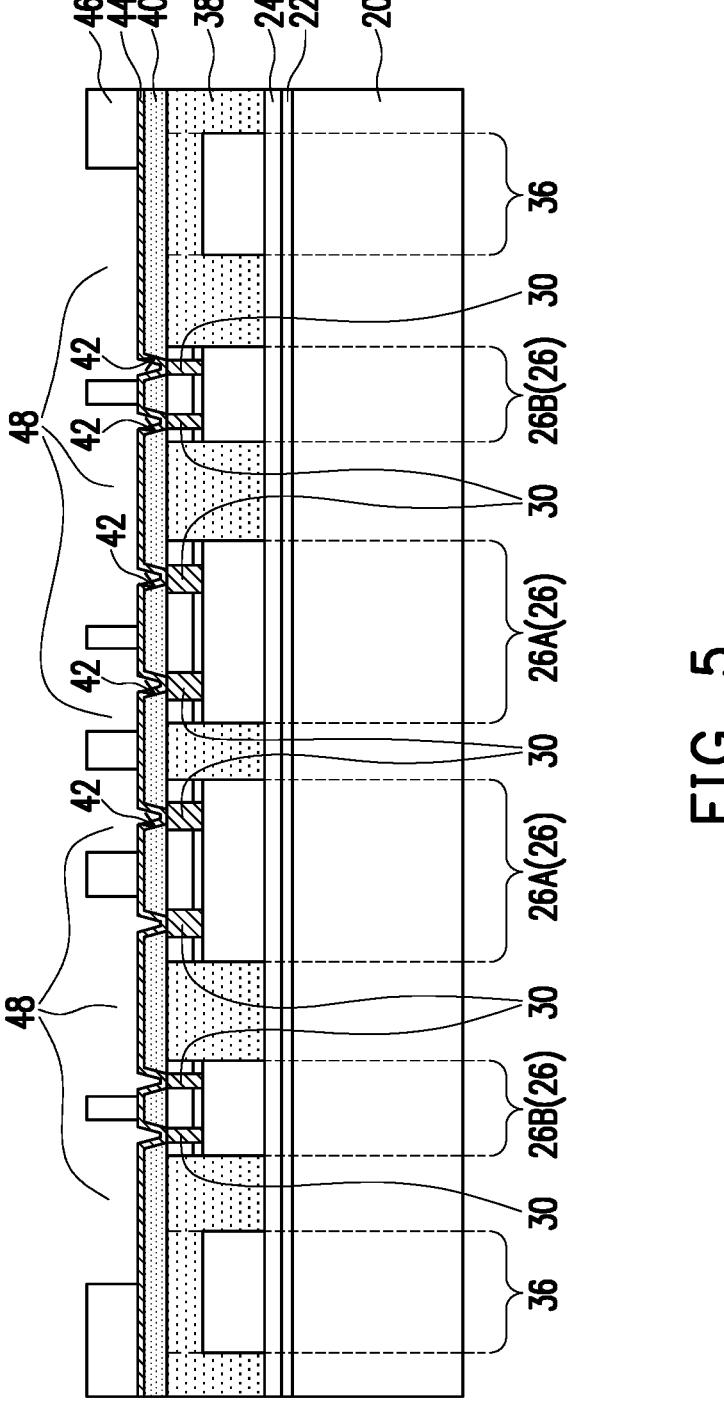

RDLs are formed to electrically connect to metal pillars 30. The respective process is also illustrated as process 210 in the process flow shown in FIG. 24. In accordance with some embodiments of the present disclosure, as shown in FIG. 5, a blanket metal seed layer 44 is formed, which includes some portions extending into openings 42, and some other portions over dielectric layer 40. Metal seed layer 44 may be formed of titanium, copper, nickel, or the like. In accordance with some embodiments of the present disclosure, metal seed layer 44 includes a titanium layer and a copper layer over the titanium layer. Plating mask 46 is then formed over metal seed layer 44, and is then patterned to form opening 48, so that some portions of metal seed layer 44 are revealed. Furthermore, openings 42 are also revealed to openings 48 in plating mask 46. Plating mask 46 may be formed of photo resist.

Figure 6:
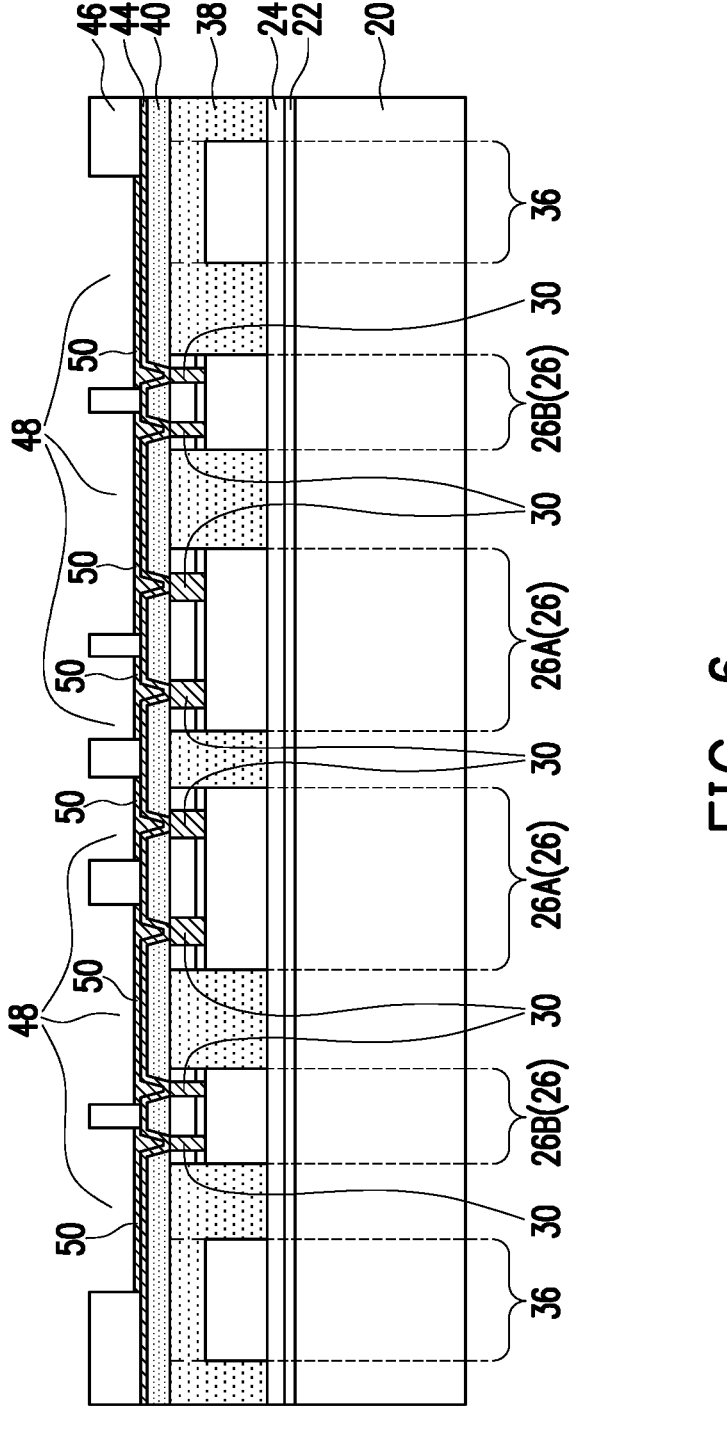

Referring to FIG. 6, a plating process is performed to form RDLs 50. The plating process may include electro-chemical plating, electro-less plating, or the like. The plated material may include a metal or a metal alloy including titanium, copper, nickel, aluminum, tungsten, multi-layers thereof, and/or alloys thereof. In a subsequent process, plating mask 46 is removed, for example, in an ashing process. The portions of the blanket copper seed layer 44 previously covered by plating mask 46 are then etched. The remaining portions of metal seed layer 44 are considered as parts of RDLs 50. RDLs 50 include via portions in dielectric layer 40, and trace (line) portions over dielectric layer 40. The trace portions may include narrow portions and wide portions, wherein the wide portions may act as metal pads.

Figure 7:
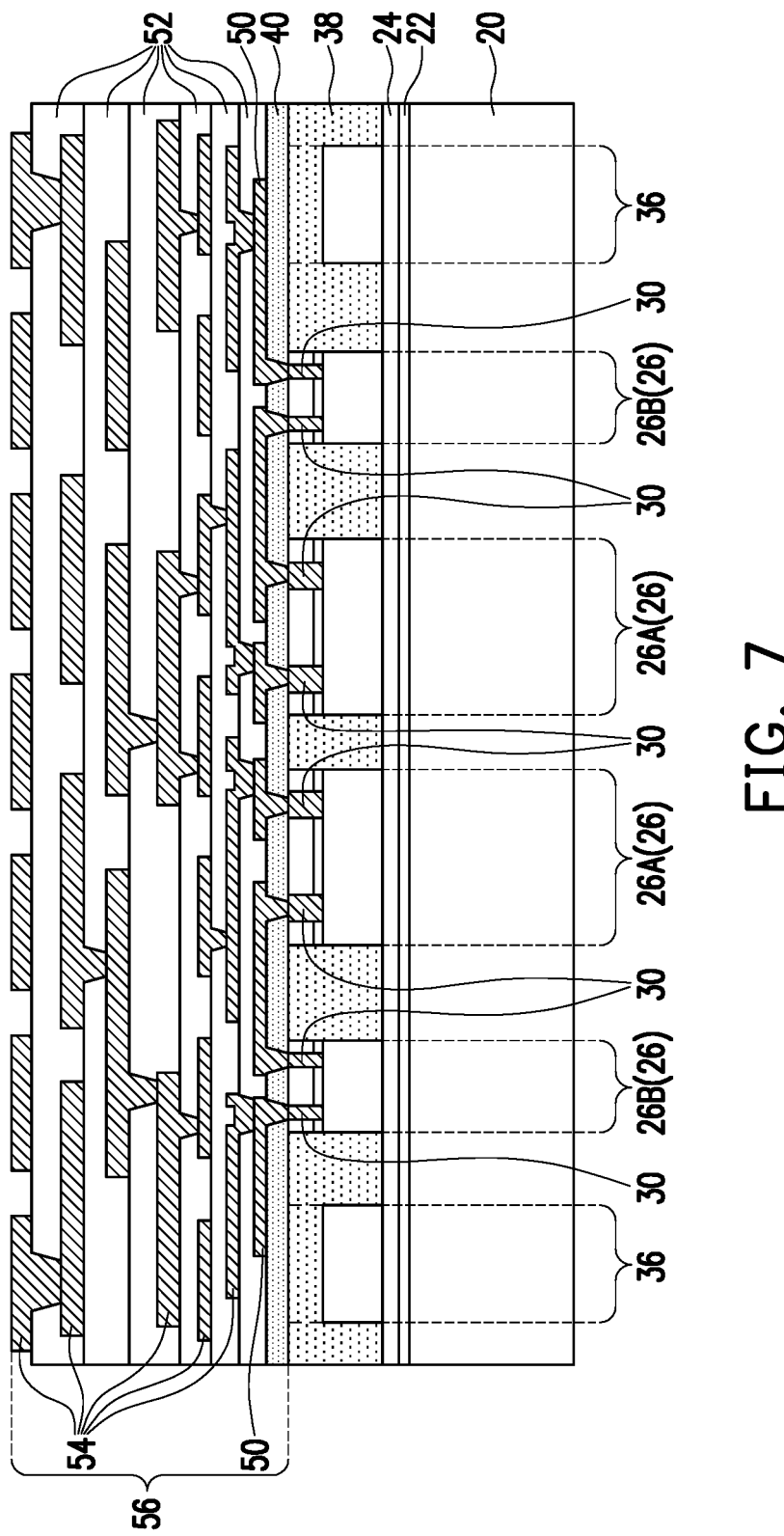

Referring to FIG. 7, in accordance with some embodiments of the present disclosure, more dielectric layers and the corresponding layers of RDLs are formed. The respective process is illustrated as process 212 in the process flow shown in FIG. 24. It is appreciated that depending on the design requirement, the number of dielectric layers and RDL layers may be more or fewer than what are illustrated. In accordance with some embodiments of the present disclosure, dielectric layers 52 are formed using the materials selected from the similar group of candidate materials for forming dielectric layer 40. RDLs 54 are formed to electrically couple to functional dies 26. RDLs 54 may be formed using similar materials and methods for forming RDLs 50. Dielectric layers 40 and 52 and RDLs 50 and 54 in combination form interconnect structure 56, which electrically interconnect all of the functional dies 26 in the package into an integrated system.

Figure 8:
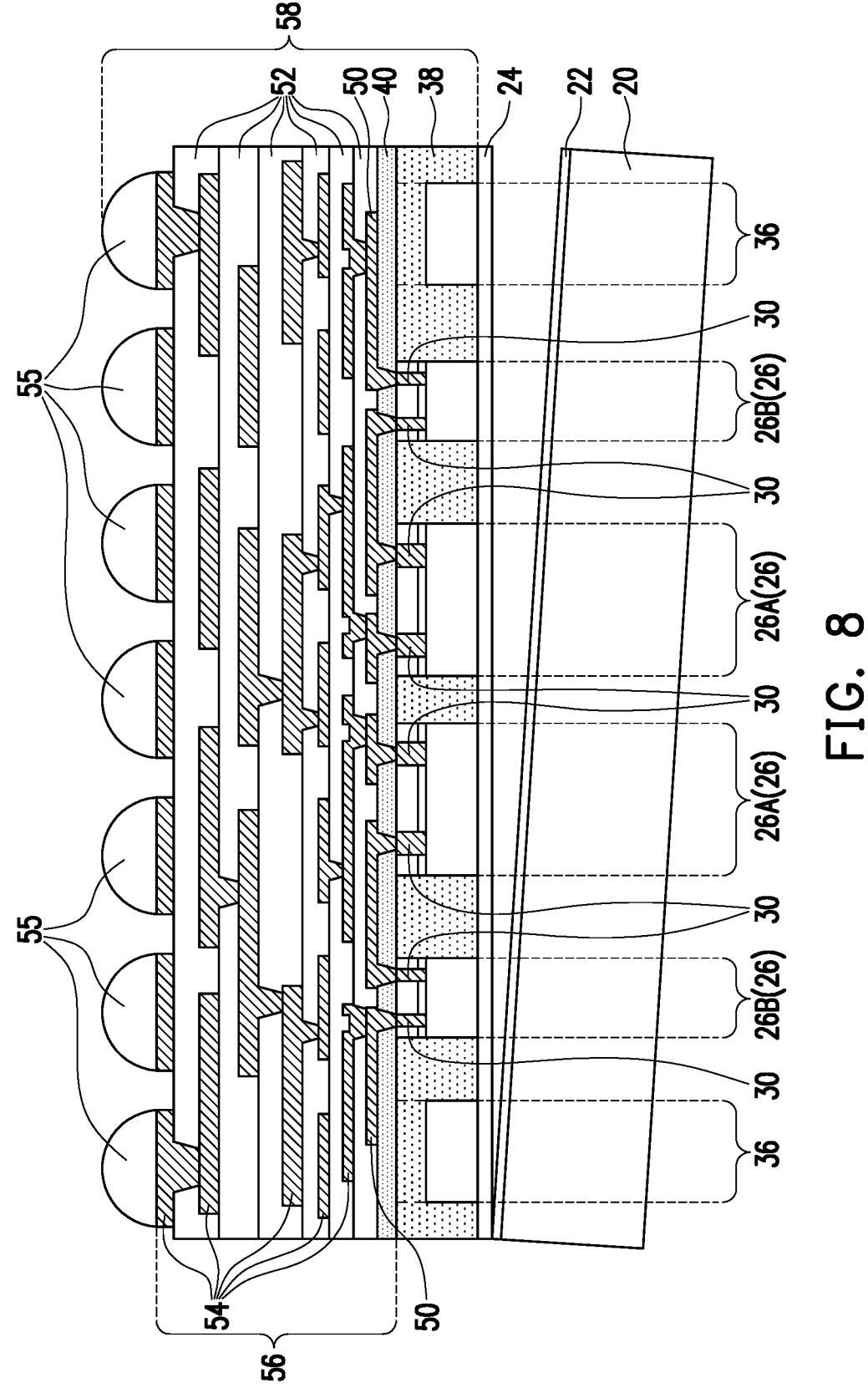

FIG. 8 illustrates the formation of electrical connectors 55. In accordance with some embodiments of the present disclosure, electrical connectors 55 are solder regions. In accordance with alternative embodiments, electrical connectors 55 include metal pillars and solder regions over the metal pillars. The formation of electrical connectors 55 may include placing solder balls on the exposed portions of the RDL pads in the top RDL layer, and then reflowing the solder balls to form solder regions. In accordance with alternative embodiments of the present disclosure, the formation of electrical connectors 55 includes performing plating processes to form metal pillars and solder regions over the metal pillars, and then reflowing the plated solder regions. Throughout the description, the features over DAF 24 are in combination referred to as package component 58, which may be reconstructed wafer 58.

In accordance with other embodiments, package component 58 may be a reconstructed panel, reconstructed substrate, or the like. For example, in the plane view of package component 58, package component 58 may have a circular shape, a rectangular shape, or the like. The package components 26 may be arranged as an array in the reconstructed panel or the reconstructed substrate.

In a subsequent process, reconstructed wafer 58 is demounted from carrier 20, for example, by projecting a light on release film 22, and the light (such as a laser beam) penetrates through the transparent carrier 20. The respective process is illustrated as process 214 in the process flow shown in FIG. 24. The release film 22 is thus decomposed, and reconstructed wafer 58 is released from carrier 20. DAF 24 may be removed in a cleaning process. The reconstructed wafer 58 is thus formed as a discrete component.

Figure 9:
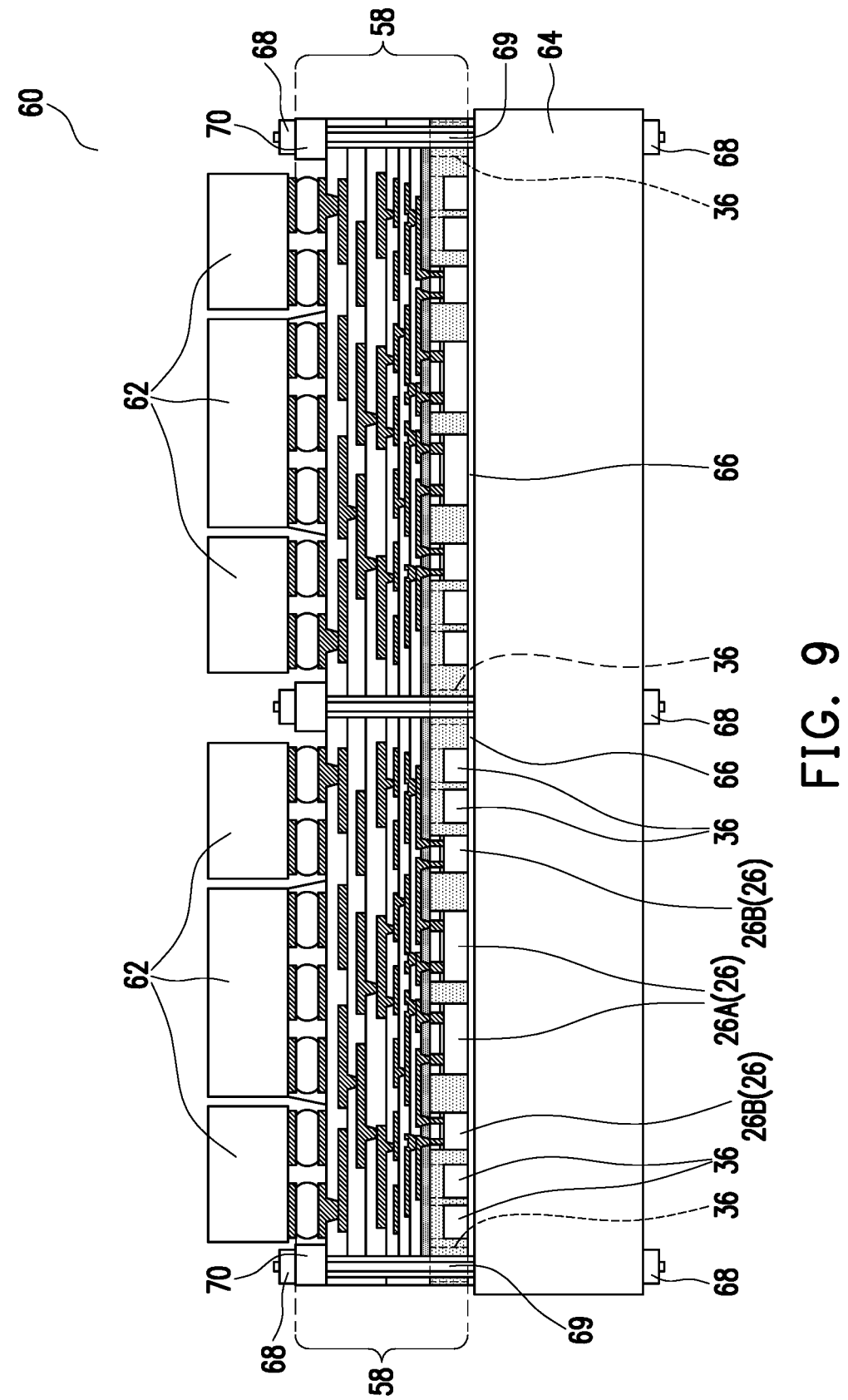
Figures 12A, 12B:
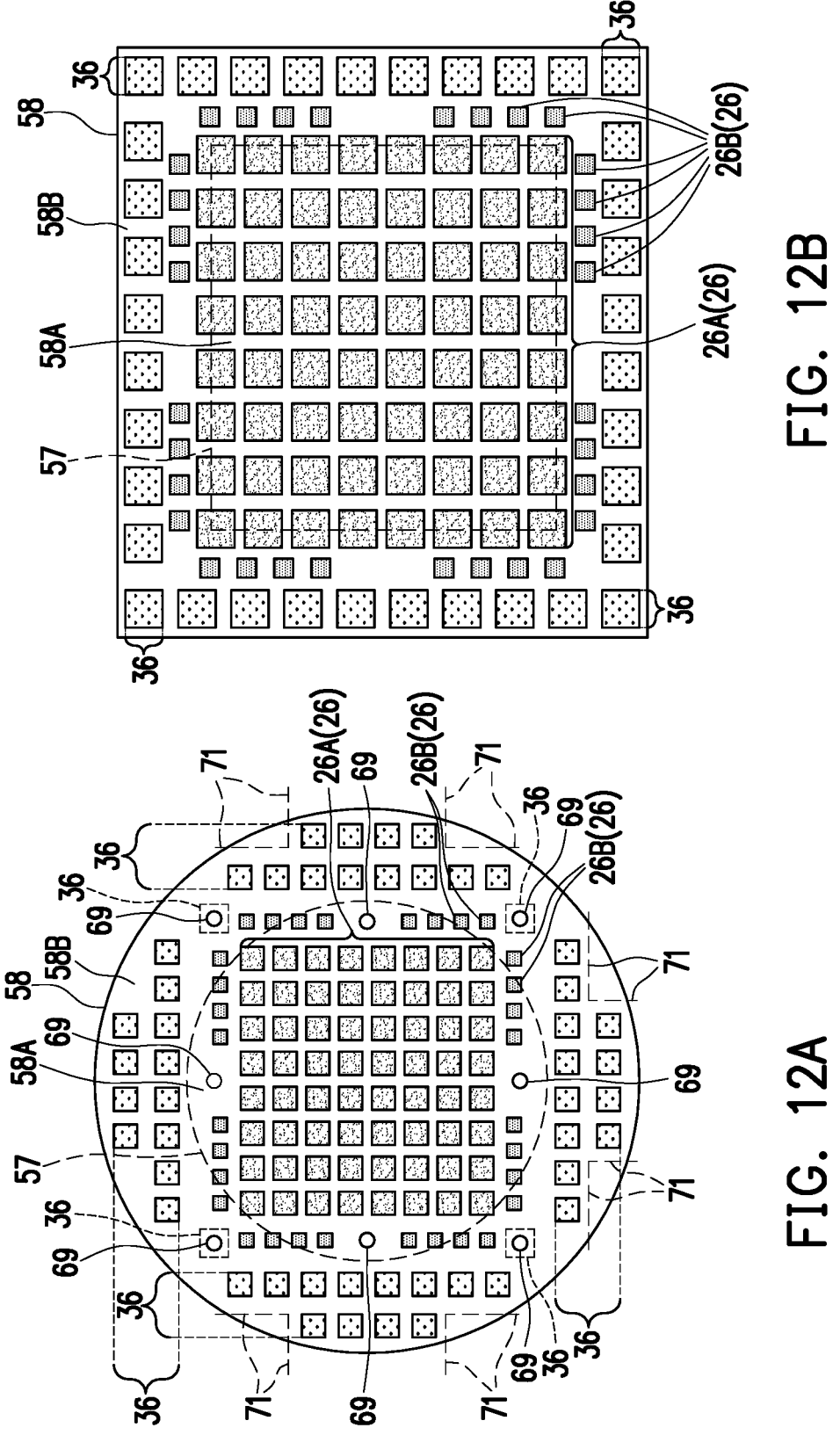
FIGS. 12A, 12B, and 13 through 23 are top views of some reconstructed wafers in accordance with some embodiments.

FIG. 9 illustrates the formation of package 60, in which reconstructed wafer 58 is incorporated. The respective process is illustrated as process 216 in the process flow shown in FIG. 24. In accordance with some embodiments of the present disclosure, the reconstructed wafer 58 that is de-bonded from carrier 20 is used in package 60 without being sawed, and all functional dies 26 and dummy dies 36 over carrier 20 (as in FIG. 7) remain in package 60. Reconstructed wafer 58 may also be trimmed, for example, by removing some edge portions that are free from functional dies 26, dummy dies 36 and RDLs. For example, FIG. 12A illustrates trimming lines 71, wherein outer portions of reconstructed wafer 58 outside of the region marked by dashed lines 71 are trimmed. At least some of the edge portions of reconstructed wafer 58 are not trimmed in accordance with some embodiments. FIG. 9 illustrates that package 60 includes two reconstructed wafer 58 as an example. It is appreciated that a package may include one or more than two reconstructed wafers. Furthermore, when having more than one reconstructed wafer 58, the reconstructed wafers 58 may have an identical structure or different structures.

In accordance with some embodiments of the present disclosure, a plurality of package components 62, which include, and are not limited to, packages, voltage regulator module, power supply module (two more specific package types are addressed), IPDs, IO connectors (such as sockets, which are used for the IO of package 60), or the like are bonded to reconstructed wafers 58. Reconstructed wafers 58 may be attached to thermal module 64 through Thermal Interface Material (TIM) 66. Screws 68, bolts 69, and stiffeners/braces 70 may be used to secure reconstructed wafer 58 onto thermal module 64. Holes may be drilled in reconstructed wafers 58 and thermal module 64, so that bolts 69 may penetrate through reconstructed wafers 58 and thermal module 64. Thermal module 64 may include heat sink, heat spreader, cold plate, or the like. When a cold plate is used, the coolant may be a gas or a liquid such as water, oil, or the like.

Figure 10:
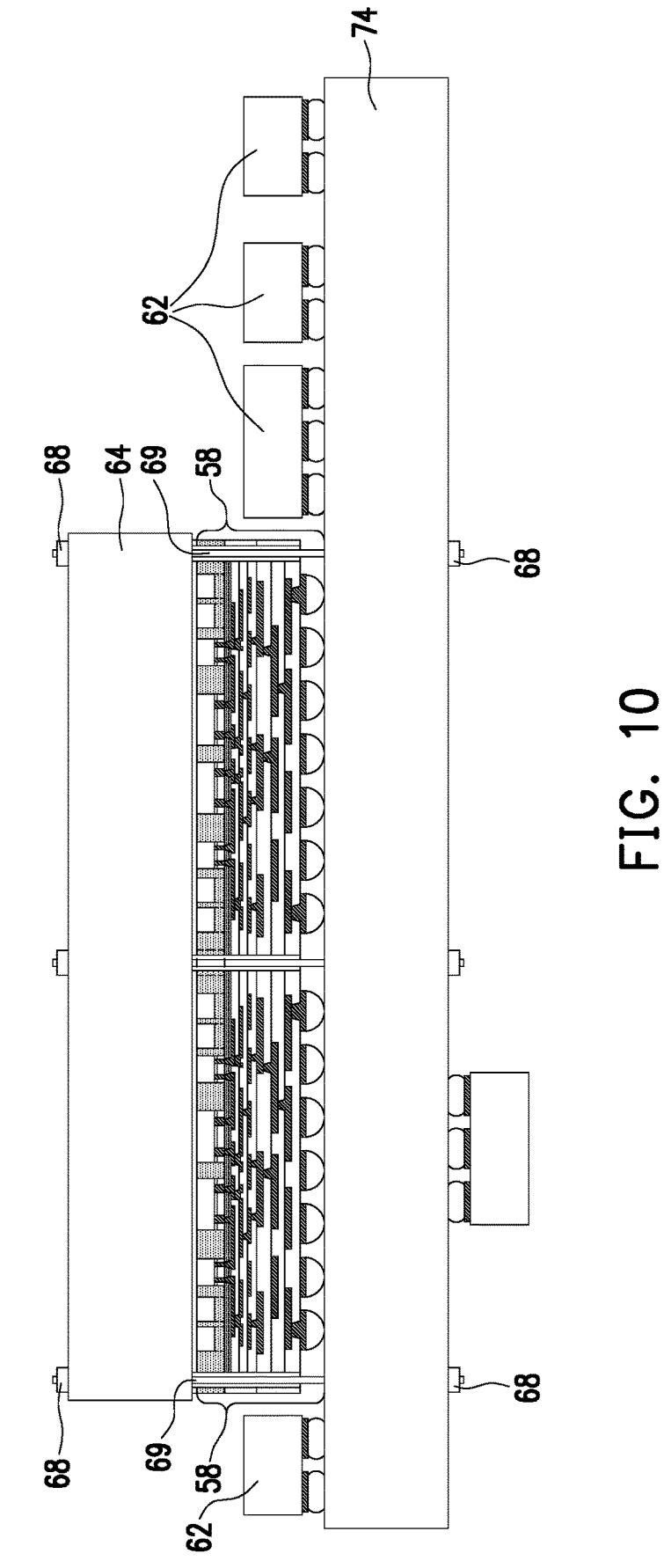
FIG. 10 illustrates a cross-sectional view of a package in accordance with some embodiments.

FIG. 10 illustrates the formation of package 72, in which reconstructed wafers 58 are incorporated. In accordance with some embodiments of the present disclosure, reconstructed wafers 58 are bonded with package component 74 through flip-chip bonding. Package component 74 may be a package substrate, an interposer, a printed circuit board, or the like. Package components 62 may be bonded to package component 74. Thermal module 64, reconstructed wafers 58, and package component 74 may be secured together by screws 68 and bolts 69. In the structures shown in FIGS. 9 and 10, bolts 69 may penetrate through package 58 without penetrating through dummy dies 36. Alternatively, some bolts 69 may penetrate through dummy dies 36, which are shown as dashed in FIG. 9 to indicate that they may or may not exist. Similarly, the bolts 69 in FIG. 10 may or may not penetrate through dummy dies 36.

The packages 60 (FIG. 9) and 72 (FIG. 10) may be High-Performance Computing (HPC) packages, the accelerators of Artificial Intelligence (AI) servers, other performance-demanding computing packages for data center applications, or packages for servers.

Figure 11B:
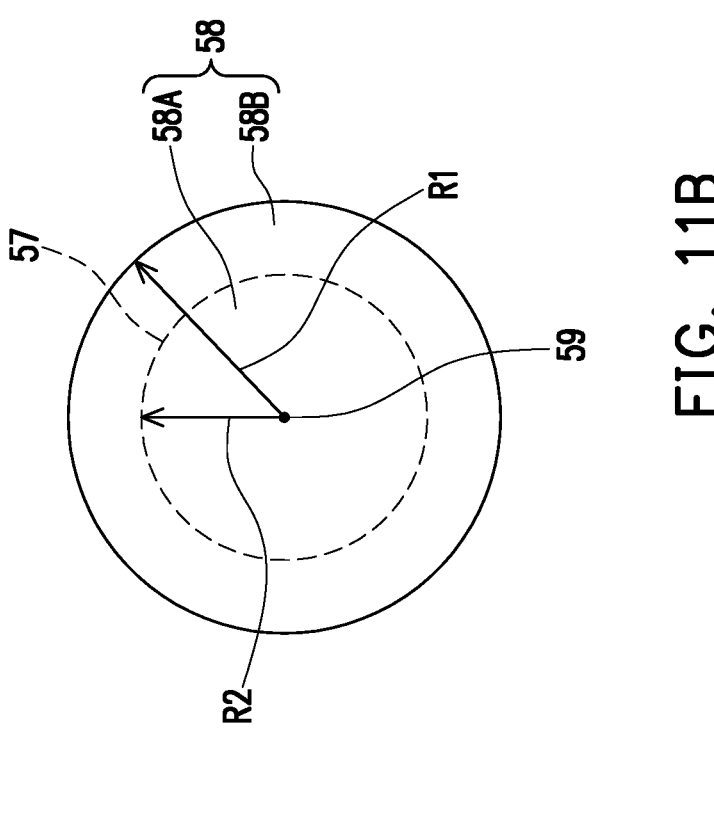
FIGS. 11A and 11B illustrate the top views of reconstructed wafers including center regions and peripheral regions in accordance with some embodiments.
Figure 11A:
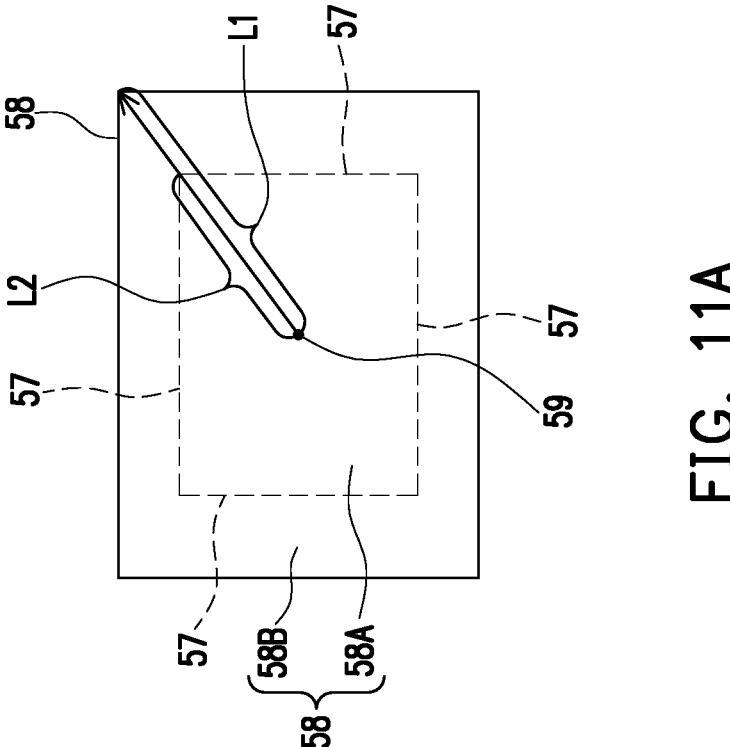

The details in the placement of functional dies 26 and dummy dies 36 (as discussed in the preceding embodiments) are discussed referring to FIGS. 11A, 11B. 12A. 12B, and 13 through 23. Reconstructed wafers 58 may be large wafers, which may have areas greater than about 10,000 mm². The area of reconstructed wafers 58 may also be in the range between about 10,000 mm² and about 70,686 mm². FIGS. 11A and 11B illustrate the center regions and peripheral regions of reconstructed wafers 58 in accordance with some embodiments. Referring to FIG. 11A, reconstructed wafer 58 has a rectangular top-view shape. Reconstructed wafer 58 has center 59. An arrow may be drawn pointing from center 59 to any edge or corner of reconstructed wafer 58. If the arrow has length L1, the arrow meets the outer boundary of center region 58A. The distance L2 from center 59 to the boundary of center region 58A will be L2, and ratio L2/L1 is equal to 2/3. The region of reconstructed wafer 58 outside of center region 58A is peripheral region 58B. Peripheral region 58B thus encircles center region 58A, with the interface between center region 58A and peripheral region 58B being shown as 57.

FIG. 11B illustrates the center region 58A and peripheral region 58B when reconstructed wafer has a circular top-view shape. Center region 58A has radius R2, and reconstructed wafer 58 has radius R1. Ratio R2/R1 is equal to 2/3. Throughout FIGS. 12A and 12B through 23, rectangles or circles 57 are illustrated, wherein the region inside rectangles or circles 57 are the center regions of the corresponding reconstructed wafers 58, and the regions outside of rectangles or circles 57 are the peripheral regions of the corresponding reconstructed wafers 58.

In accordance with some embodiments of the present disclosure, as shown in FIGS. 12A, 12B, and 13 through 23, dummy dies 36 are mainly placed in peripheral regions 58B of reconstructed wafers 58. Center regions 58A may be free from dummy dies 36, or may include some of dummy dies 36. Peripheral regions 58B may be free from functional dies 26, or may include some of functional dies 26. It is assumed that in a region (center region 58A or peripheral region 58B), the total top-view area of all functional dies 26 is equal to F, and the total top-view area of all dummy dies 36 is equal to D. In center regions 58A of reconstructed wafers 58, the ratio D/F may be in the range between about 0 and about 1, and may be in the range between about 0.25 and about 0.5. In peripheral regions 58B of reconstructed wafers 58, the ratio F/D may be in the range between about 0 and about 2/3, and may be in the range between about 0.2 and about 2/3. For example, in the peripheral region, ratio F/D may be in the range between about 0.3 and about 0.5.

It is appreciated that carrier 20 (FIG. 8) may have a shape and a size same as (or similar to) the shape and the size of reconstructed wafer 58. Accordingly, carrier 20 may also be divided into a center region and a peripheral region same as that of reconstructed wafer 58. Before reconstructed wafer 58 is demounted from carrier 20, the center region 58A and the peripheral region 58B of reconstructed wafer 58 overlap the center region and the peripheral region, respectively, of carrier 20.

It is appreciated that the reconstructed wafers 58 as shown in FIGS. 12A, 12B, and 13 through 23 may be the wafers that are already in package 60 (FIG. 9) or 72 (FIG. 10), and hence no more singulation and trimming is performed on the reconstructed wafers 58. Some of reconstructed wafers 58 as shown in FIGS. 12A, 12B, and 13 through 23 may be trimmed (but not singulated), as shown in FIG. 12A as an example, and then used to form package 60 (FIG. 9) or 72 (FIG. 10). However, no dummy die and functional die will be trimmed off from reconstructed wafer 58. Throughout embodiments as shown in FIGS. 12A, 12B, and 13 through 23, dummy dies 36 may have sizes same as each other or different from each other. Also, the placement of dummy dies 36 may follow certain pattern such as arrays or other repeated patterns, or may be placed in a random layout. In the peripheral region 58B, dummy dies 36 may be distributed substantially uniformly and have a substantially uniform density. In FIGS. 12A, 12B, and 13 through 23, there may be some vacancies illustrated, for example, in the peripheral regions 58B. These vacancies may be left and used for the attachment of screw bolts, or may be placed with dummy dies as well. Also, some of bolts 69 (refer to FIG. 12A as an example) may penetrate through dummy dies 36, and some other bolts 69 may penetrate through reconstructed wafer 58 without penetrating through dummy dies 36. Alternatively, none of the bolts 69 penetrate through dummy dies 36. The penetration (or non-penetration) of bolts 69 through dummy dies 36 also apply to the embodiments in FIGS. 12B and 13 through 23, although bolts 69 are not shown in these figures.

In FIGS. 12A, 12B, and 13 through 23, dies 26A represent logic dies such as computing dies (for data computing, for example) or other types of dies such as passive dies, photonic dies, or the like, and dies 26B represent IO dies, and may represent other types of dies such as passive dies, photonic dies, or the like. IO dies 26B are used for data input and output between reconstructed wafer 58 and external components. In accordance with some embodiments of the present disclosure, IO dies 26B are placed aligning to a ring around logic/computing dies 26A to minimize the routing distance between the computing dies 26A, so that performance is enhanced. The plurality of logic/computing dies 26A may be identical to each other, or may be different from each other. Also, not all of dies in FIGS. 12A, 12B, and 13 through 23 are marked, and whether a die is a logic/computing die, an IO die, or a dummy die may be found referring to their corresponding hatching patterns.

FIG. 12A illustrates the top view of reconstructed wafer 58 in accordance with some embodiments, in which reconstructed wafer 58 has a round top-view shape. In accordance with some embodiments of the present disclosure, as shown in FIG. 12A, the edge of reconstructed wafer 58 is a full circle. In accordance with alternative embodiments of the present disclosure, reconstructed wafer 58 has some edge portions trimmed, wherein the trimmed portions are marked by dashed lines 71. In accordance with alternative embodiments, all of edge portions of reconstructed wafer 58 are trimmed, while no functional die or dummy die is trimmed. Accordingly, the new edges of the trimmed reconstructed wafer 58 are closer to dummy dies 36. It is appreciated that although FIG. 12A is used as an example to discuss the trimming of reconstructed wafer 58, the above-discussed trimming (or not trimming) schemes may be applied to the embodiments in FIGS. 12B and 13 through 23 also. The circle 57 represents the boundary between the center region 58A and the peripheral region 58B. In accordance with some embodiments of the present disclosure, all dummy dies 36 are in peripheral region 58B. A majority of functional dies 26 are in center region 58A, and the rest of the functional dies 26 are in peripheral region 58B.

FIG. 12B illustrates the top view of reconstructed wafer 58 in accordance with some embodiments, in which reconstructed wafer 58 has a rectangular top-view shape. The rectangle 57 represents the boundary between the center region 58A and the peripheral region 58B. In accordance with some embodiments of the present disclosure, all dummy dies 36 are in peripheral region 58B. A majority of functional dies 26 are in center region 58A, and the rest of the functional dies 26 are in peripheral region 58B. Also, all IO dies 26B may be in peripheral region 58B.

Figures 13, 14:
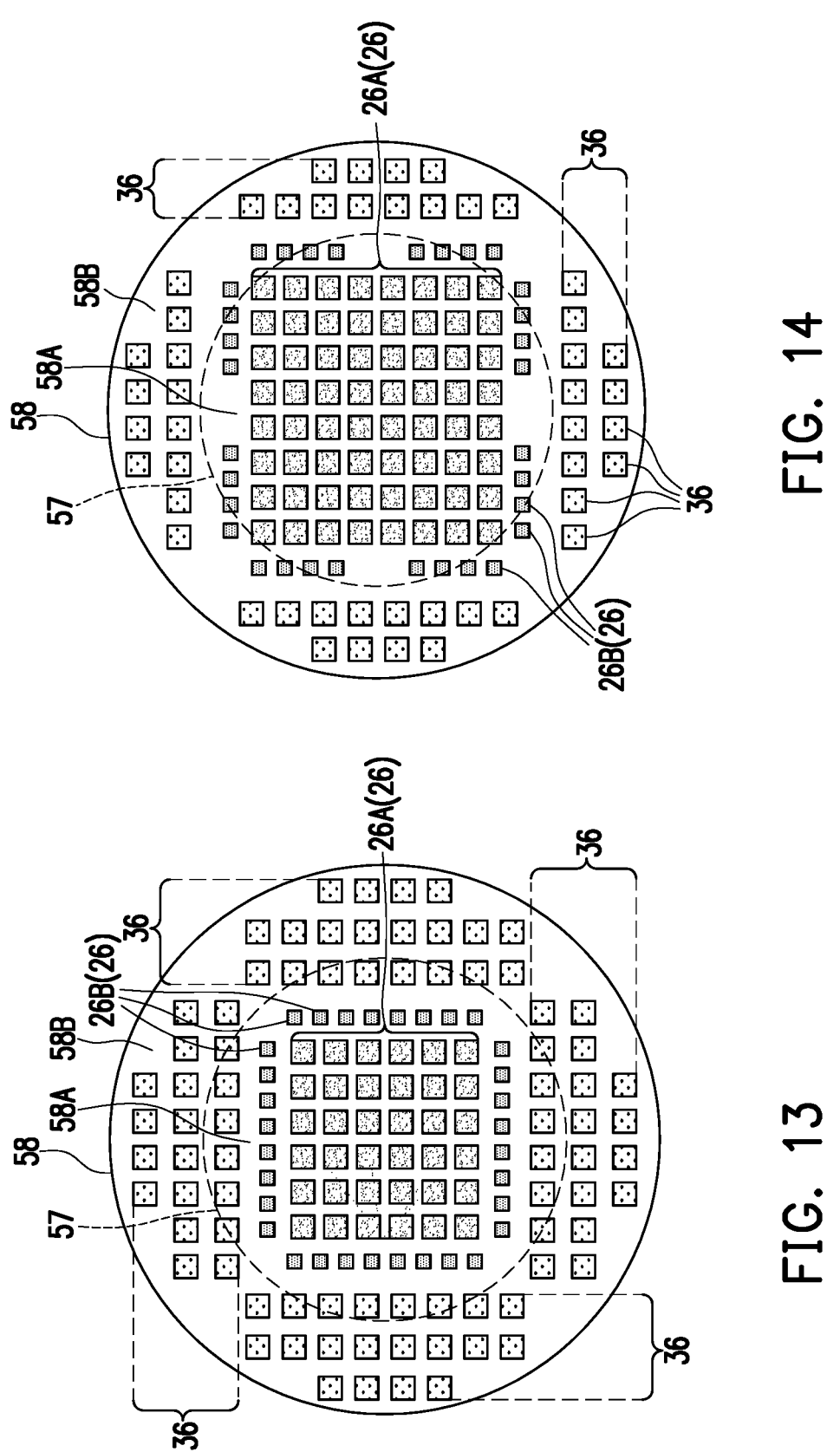
Figure 15:
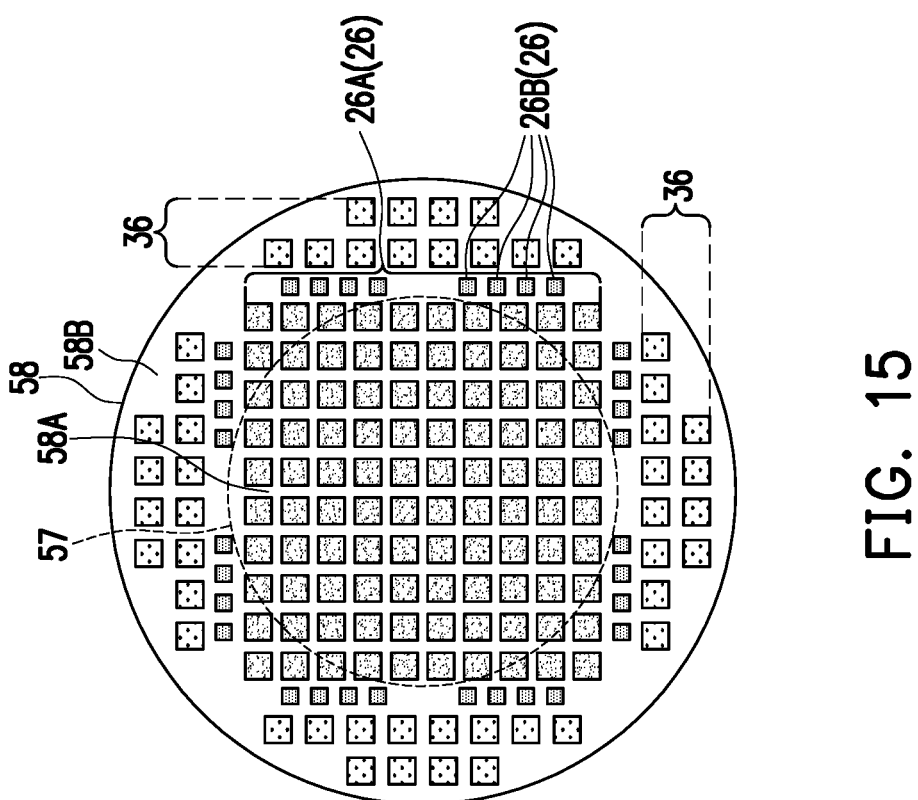

FIGS. 13, 14, and 15 illustrate the reconstructed wafers 58 having rounded top-view shapes. In FIG. 13, all of functional dies 26 including all of computing dies 26A and IO dies 26B are in center region 58A. Some of dummy dies extend into center region 58A, while the rest are in peripheral region 58B. In FIG. 14, some of functional dies 26 are in center region 58A, and some functional dies 26 extend into peripheral region 58B. Furthermore, in accordance with some embodiments of the present disclosure, some IO dies 26B are in center region 58A, and some IO dies 26B are in peripheral region 58B. All of the dummy dies 36 are in peripheral region 58B. In FIG. 15, all of IO dies 26B are in peripheral region 58B, and some of logic/computing dies 26A are in center region 58A, and the rest are in peripheral region 58B. All of dummy dies 36 are in peripheral region 58B.

Figures 16, 17:
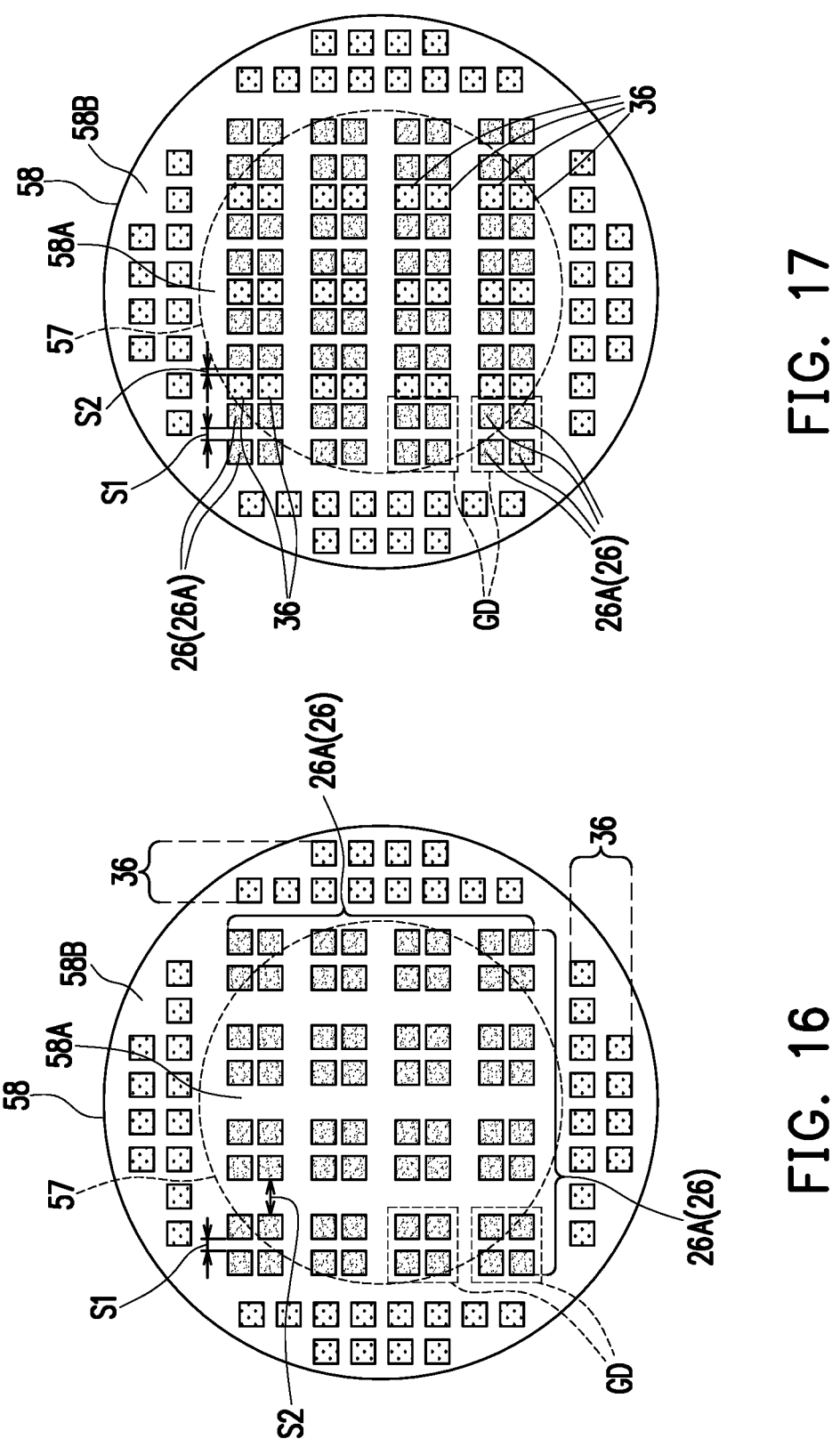

In FIGS. 12A, 12B, and 13 through 15, logic/computing dies 26A are arranged as an array, and no IO dies and dummy dies are inserted into the array. FIGS. 16 through 23 illustrate the dies disposed as groups (GD as shown in FIG. 16). The groups GD may have structures identical to each other. Each of the groups GD may include logic/computing dies 26A, and may or may not include other types of dies such as IO dies 26B, dummy dies 36, passive device dies, and/or the like. This setting may alternatively be considered as that functional dies 26 are grouped, and dummy dies 36 may or may not be inserted to fill the space between the groups. The inner-group spacing between the logic/computing dies 26A in the same group may be equal to or smaller than the inter-group spacing between groups. For example, FIG. 16 illustrates that inner-group spacing S1 is smaller than inter-group spacing S2. FIG. 17 illustrates dummy dies 36 placed between functional dies 26. In FIG. 17, if dummy dies 36 are considered as parts of the groups, inner-group spacing S1 may be equal to inter-group spacing S2. Alternatively, if dummy dies 36 are not considered as parts of the groups, inner-group spacing S1 will be smaller than the inter-group spacing, and dummy dies 36 are inserted between the groups.

Figures 18, 19:
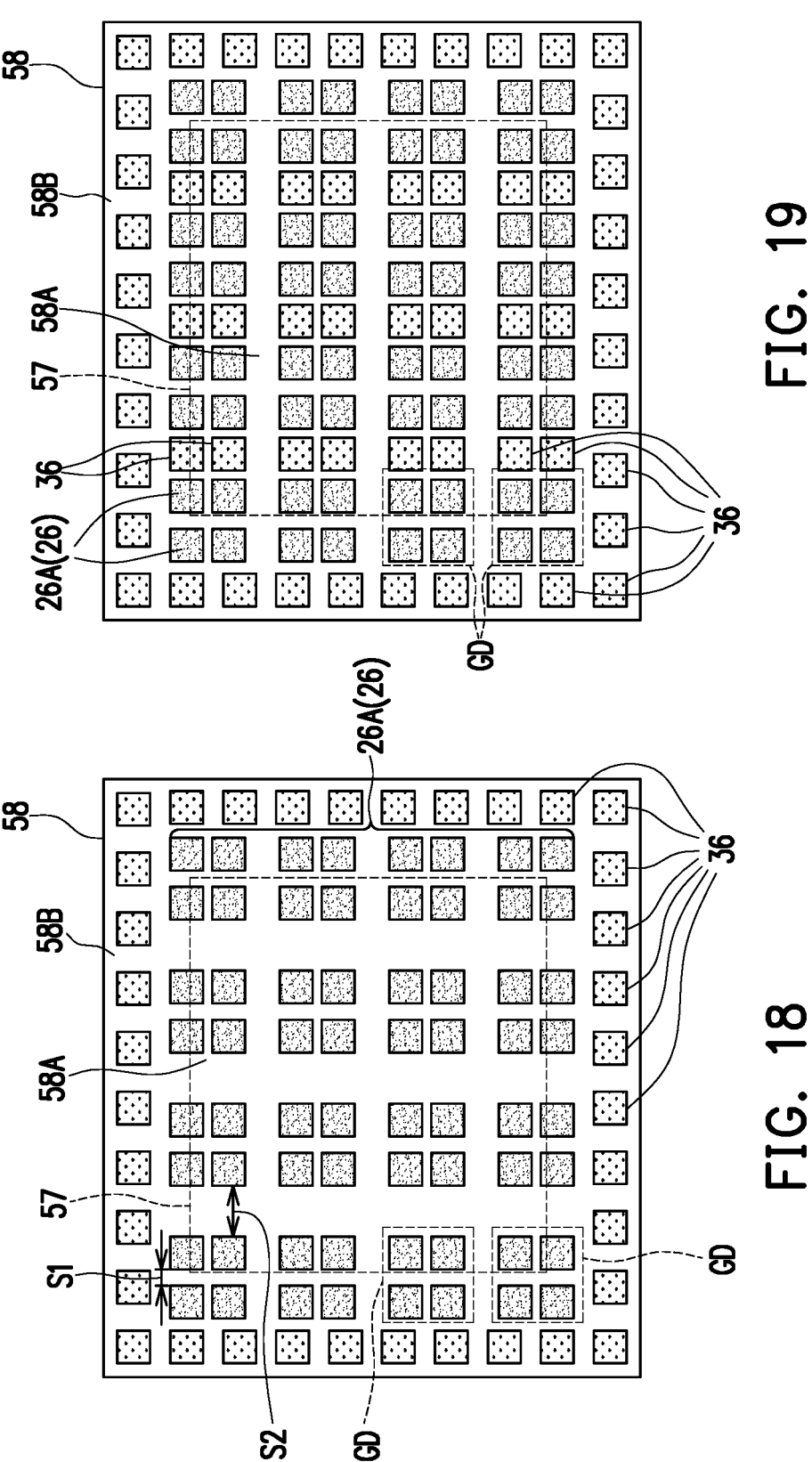

Referring to FIG. 16, each of groups GD includes logic/computing dies 26A, and does not include IO dies and dummy dies. In the embodiments shown in FIG. 17, each of groups GD includes logic/computing dies 26A and does not include IO dies. FIGS. 18 and 19 illustrate similar arrangements as in FIGS. 16 and 17, respectively, except that the reconstructed wafer 58 in FIGS. 16 and 17 have round top-view shapes, while the reconstructed wafers 58 in FIGS. 18 and 19 have rectangular top-view shapes.

Figures 20, 21:
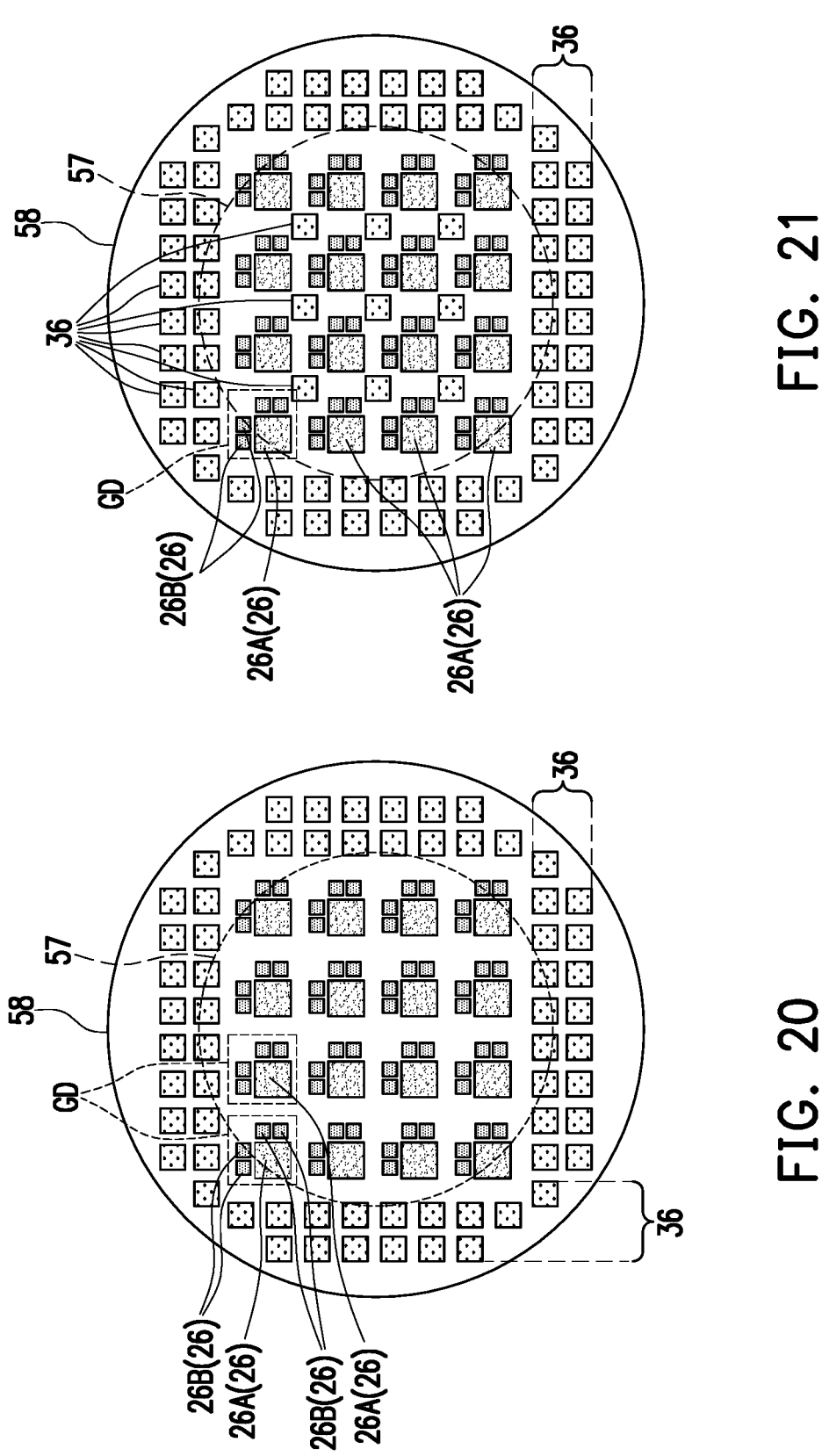
Figures 22, 23:
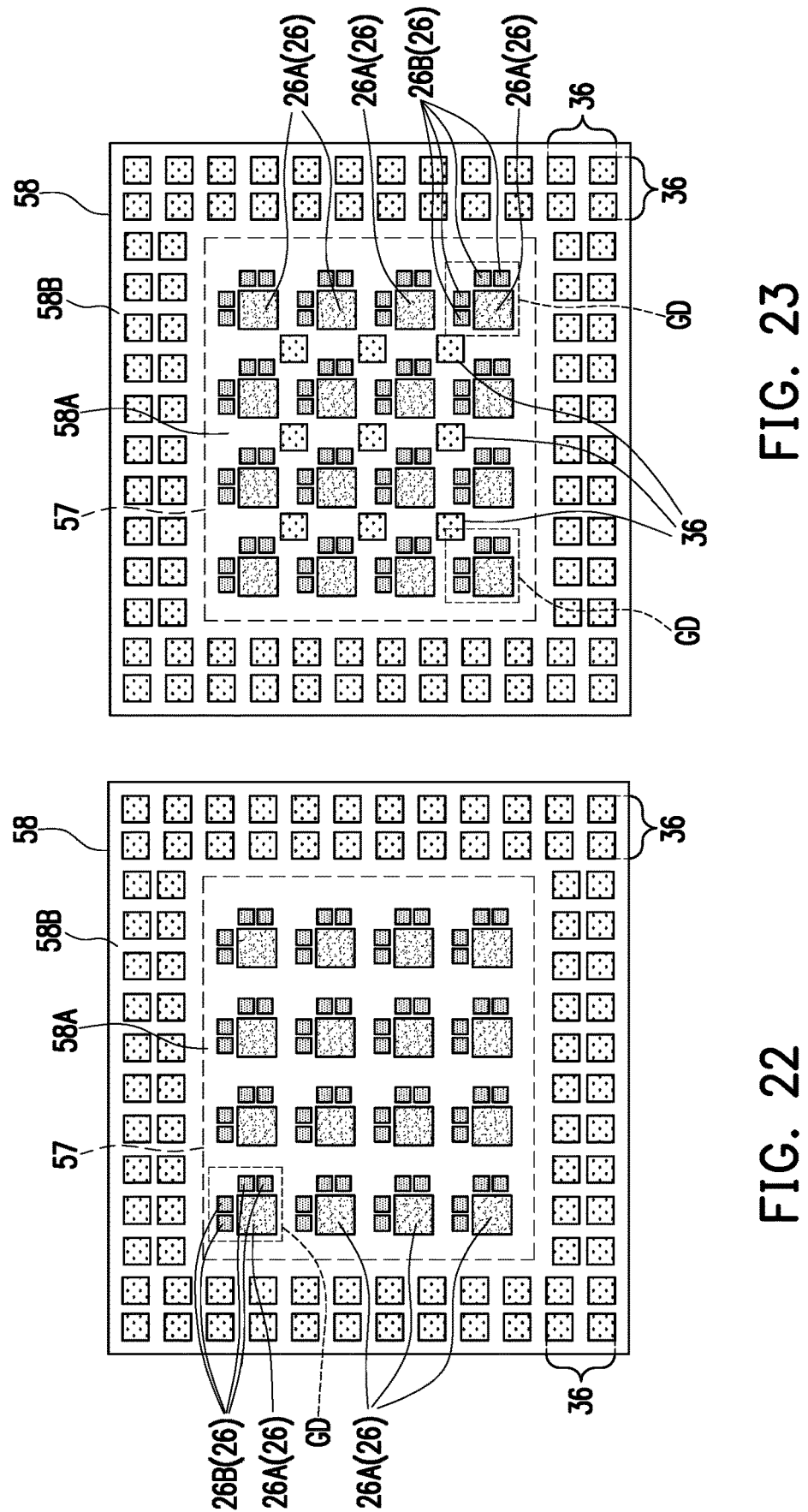

FIG. 20 illustrates that each of the groups GD includes logic/computing dies 26A and IO dies 26B, and no dummy dies are in the groups. Alternatively stated, no dummy dies are inserted between groups. FIG. 21 illustrates that each of the groups GD includes logic/computing dies 26A, IO dies 26B, and dummy die(s) 36, or alternatively stated, dummy dies 36 are inserted between groups if dummy dies 36 are not considered as parts of groups GD. FIGS. 22 and 23 illustrate similar arrangements as in FIGS. 20 and 21, respectively, except that the reconstructed wafers 58 in FIGS. 20 and 21 have round top-view shapes, while the reconstructed wafer 58 in FIGS. 22 and 23 have rectangular top-view shapes.

In above-illustrated embodiments, some processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By arranging dummy dies in reconstructed wafers, the spaces that otherwise will be occupied by an encapsulant such as molding compound is occupied by dummy dies. Since the CTE of the dummy dies is closer to the CTE of the functional dies than to the encapsulant, adding dummy dies may reduce the stress and the warpage of the reconstructed wafers. Furthermore, the dummy dies include at least some portions in the peripheral region encircling the functional dies, adding the dummy dies in the peripheral region may improve the yield in the packaging process since the reconstructed wafers may have warpage, which resulting in the edge portions of the reconstructed wafer to lose focus in lithography processes. Occupying the edge portions of the reconstructed wafers with the dummy dies not only reduces the warpage, but also leaves some edge portions that suffer from de-focusing not used, and hence the yield is improved.

In accordance with some embodiments of the present disclosure, a method includes placing a plurality of functional dies over a carrier; placing a plurality of dummy dies over the carrier; encapsulating the plurality of functional dies and the plurality of dummy dies in an encapsulant; forming redistribution lines over and interconnecting the plurality of functional dies, wherein the redistribution lines, the plurality of functional dies, the plurality of dummy dies, and the encapsulant in combination form a reconstructed wafer, wherein the plurality of functional dies are in a center region of the reconstructed wafer, and the plurality of dummy dies are in a peripheral region of the reconstructed wafer, with the peripheral region encircling the center region; de-bonding the reconstructed wafer from the carrier; and bonding the reconstructed wafer to a package component selected from the group consisting essentially of an interposer, a package substrate, a printed circuit board, a thermal module, and combinations thereof. In an embodiment, the plurality of dummy dies are distributed substantially uniformly in the peripheral region. In an embodiment, the reconstructed wafer bonded to the package component has a round top-view shape. In an embodiment, the reconstructed wafer is un-sawed before being bonded to the package component. In an embodiment, the method further comprises securing the reconstructed wafer to the package component through a bolt penetrating through the reconstructed wafer. In an embodiment, the bolt penetrates through one of the plurality of dummy dies. In an embodiment, the encapsulating comprises dispensing the encapsulant; and planarizing the encapsulant, wherein a dummy die in the plurality of dummy dies is polished in the planarizing. In an embodiment, the plurality of dummy dies are thinner than the plurality of functional dies, and wherein the encapsulating comprises dispensing the encapsulant; and planarizing the encapsulant, wherein after the planarizing, a layer of the encapsulant covers the plurality of dummy dies. In an embodiment, the plurality of functional dies are placed as a plurality of groups, with inner-group spacings between dies in a same group being smaller than inter-group spacings between neighboring ones of the plurality of groups. In an embodiment, the method further comprises placing an additional plurality of dummy dies between the plurality of groups. In an embodiment, dies in one of the plurality of groups comprise a computing die and an input-output die. In an embodiment, the method further comprises placing a plurality of input-output dies surrounding the plurality of functional dies.

In accordance with some embodiments of the present disclosure, a method includes placing a plurality of logic dies over a carrier; placing a plurality of IO dies over the carrier; placing a plurality of dummy dies over the carrier, wherein the plurality of dummy dies are distributed surrounding a region in which the plurality of logic dies and the plurality of IO dies are located; encapsulating the plurality of logic dies, the plurality of IO dies, and the plurality of dummy dies in an encapsulant; forming redistribution lines over and electrically coupling to the plurality of logic dies and the plurality of IO dies to form a reconstructed wafer, and the reconstructed wafer comprises the plurality of logic dies, the plurality of IO dies, the plurality of dummy dies, the encapsulant, and the redistribution lines; and de-bonding the reconstructed wafer from the carrier. In an embodiment, the method further comprises, without sawing the reconstructed wafer, bonding the reconstructed wafer to a package component. In an embodiment, the method further comprises, before the encapsulating, inserting a dummy die between two of the plurality of logic dies. In an embodiment, the plurality of logic dies are placed as parts of a plurality of groups, with inner-group spacings between dies in a same group being smaller than inter-group spacings between neighboring ones of the plurality of groups. In an embodiment, the plurality of IO dies are placed as parts of the plurality of groups.

In accordance with some embodiments of the present disclosure, a package includes a reconstructed wafer comprising a plurality of dummy dies; a plurality of functional dies in a center region of the package, wherein the plurality of dummy dies are allocated aligning a ring encircling the plurality of functional dies; an encapsulant encapsulating the plurality of dummy dies and the plurality of functional dies therein; and a plurality of RDLs over the plurality of functional dies, wherein the plurality of RDLs interconnect all functional dies in the package into an integrated system. In an embodiment, the package further comprises a package component bonded to the reconstructed wafer, wherein the package component is selected from the group consisting essentially of an interposer, a package substrate, a printed circuit board, a thermal module, and combinations thereof. In an embodiment, the reconstructed wafer that is bonded to with the package component has a round top-view shape.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

12

What is claimed is:

1. A package comprising:
a reconstructed wafer comprising:
    a plurality of dummy dies;
    a bolt penetrating through the reconstructed wafer, wherein the bolt penetrates through one of the plurality of dummy dies;
    a plurality of functional dies in a middle region of the package, wherein the plurality of dummy dies are aligned to a ring encircling the plurality of functional dies;
    an encapsulant encapsulating the plurality of dummy dies and the plurality of functional dies therein; and
    a plurality of Redistribution Lines (RDLs) over the plurality of functional dies, wherein the plurality of RDLs interconnect all functional dies in the package into an integrated system, wherein the package comprises the plurality of dummy dies, the plurality of functional dies, and the plurality of RDLs therein.

2. The package of claim 1, wherein the reconstructed wafer comprises a plurality of curved edges, and the plurality of curved edges fit a same circle.

3. The package of claim 2, wherein the reconstructed wafer further comprises a plurality of straight edges between and connected to the curved edges.

4. The package of claim 1, wherein the reconstructed wafer has a round top-view shape.

5. The package of claim 1 further comprising a thermal module attached to the reconstructed wafer.

6. The package of claim 1 further comprising a thermal interface material contacting the plurality of functional dies and the encapsulant.

7. The package of claim 1, wherein the plurality of dummy dies are distributed substantially uniformly in a peripheral region surrounding the middle region.

8. The package of claim 1, wherein the plurality of functional dies are distributed in a plurality of groups, with inner-group spacings between dies in a same group being smaller than inter-group spacings between neighboring ones of the plurality of groups, and the package further comprising:
    an additional plurality of dummy dies between the plurality of groups.

9. The package of claim 1, wherein the reconstructed wafer has a rectangular top-view shape.

10. The package of claim 5, wherein the bolt further penetrates through the thermal module.

11. A package comprising:
a plurality of logic dies, a plurality of IO dies, and a plurality of dummy dies;
an encapsulant encapsulating the plurality of logic dies, the plurality of IO dies, and the plurality of dummy dies;
redistribution lines over and electrically coupling to the plurality of logic dies and the plurality of IO dies to form a reconstructed wafer;
a package component bonding to the reconstructed wafer, wherein the reconstructed wafer bonding to the package component comprises the plurality of dummy dies therein;
a bolt and a screw securing the reconstructed wafer on the package component, wherein the bolt penetrates through one of the plurality of dummy dies in the reconstructed wafer; and
a thermal interface material contacting the reconstructed wafer, wherein the package comprises the plurality of logic dies, the plurality of IO dies, and the redistribution lines therein.

12. The package of claim 11, wherein an entirety of one of the plurality of dummy dies is formed of a homogenous material.

13. The package of claim 11 further comprising:

a dielectric layer contacting the encapsulant and the plurality of logic dies, wherein parts of the redistribution lines extend into the dielectric layer, and wherein one of the plurality of dummy dies is in contact with the dielectric layer.

14. The package of claim 11 further comprising:

a dielectric layer contacting the encapsulant and the plurality of logic dies, wherein parts of the redistribution lines extend into the dielectric layer, and wherein one of the plurality of dummy dies is spaced apart from the dielectric layer by a portion of the encapsulant.

15. A package comprising:

a plurality of device dies;

a plurality of dummy dies aligned to a ring, wherein the ring encircles the plurality of device dies;

an encapsulant encapsulating the plurality of device dies and the plurality of dummy dies therein;

a redistribution structure over and electrically coupling to the plurality of device dies to form a reconstructed wafer;

a first package component over and bonding to the reconstructed wafer, wherein the first package component comprises a device die, and the first package component overlaps one of the plurality of dummy dies;

a bolt penetrating through the reconstructed wafer and one of the plurality of dummy dies; and a screw attached to the bolt, wherein the package comprises the plurality of device dies, the plurality of dummy dies, and the redistribution structure therein.

16. The package of claim 15 further comprising a second package component electrically connected to the plurality of device dies, wherein the second package component is selected from the group consisting essentially of an interposer, a package substrate, a printed circuit board, a thermal module, and combinations thereof.

17. The package of claim 15, wherein the plurality of device dies comprises:

a plurality of functional dies; and a plurality of input-output dies surrounding the plurality of functional dies.

18. The package of claim 15, wherein the first package component that overlaps the one of the plurality of dummy dies is bonded to the reconstructed wafer through solder regions.

19. The package of claim 15, wherein the reconstructed wafer that is bonded to the first package component has a round top-view shape.

20. The package of claim 16, wherein the bolt further penetrates through the second package component.

* * * * *